(12) United States Patent
Nakamura

(10) Patent No.: US 8,937,310 B2
(45) Date of Patent: Jan. 20, 2015

(54) DETECTION METHOD FOR SEMICONDUCTOR INTEGRATED CIRCUIT DEVICE, AND SEMICONDUCTOR INTEGRATED CIRCUIT DEVICE

(75) Inventor: Tomonori Nakamura, Hamamatsu (JP)

(73) Assignee: Hamamatsu Photonics K.K., Hamamatsu-shi, Shizuoka (JP)

( * ) Notice: Subject to any disclaimer, the term of this patent is extended or adjusted under 35 U.S.C. 154(b) by 215 days.

(21) Appl. No.: 13/703,945

(22) PCT Filed: Jun. 13, 2011

(86) PCT No.: PCT/JP2011/063520
§ 371 (c)(1),
(2), (4) Date: Dec. 13, 2012

(87) PCT Pub. No.: WO2011/158797
PCT Pub. Date: Dec. 22, 2011

(65) Prior Publication Data
US 2013/0087788 A1    Apr. 11, 2013

(30) Foreign Application Priority Data
Jun. 17, 2010  (JP) .................. 2010-138618

(51) Int. Cl.
*H01L 23/58* (2006.01)
*H01L 21/66* (2006.01)
*H01L 23/48* (2006.01)
*H01L 25/065* (2006.01)
*H01L 25/00* (2006.01)
*H01L 27/08* (2006.01)

(52) U.S. Cl.
CPC .............. *H01L 22/14* (2013.01); *H01L 23/481* (2013.01); *H01L 25/0657* (2013.01); *H01L 25/50* (2013.01); *H01L 27/0817* (2013.01); *H01L 22/30* (2013.01); *H01L 22/20* (2013.01); *H01L 2225/06513* (2013.01); *H01L 2225/06541* (2013.01); *H01L 2225/06596* (2013.01); *H01L 2224/16145* (2013.01); *H01L 2224/32145* (2013.01); *H01L 2224/73204* (2013.01)
USPC ............. 257/48; 257/E21.531; 257/E23.002; 438/17

(58) Field of Classification Search
None
See application file for complete search history.

(56) References Cited

U.S. PATENT DOCUMENTS

2009/0153177 A1*  6/2009  Shibata ................. 324/765

FOREIGN PATENT DOCUMENTS

CN        1606808      4/2005
JP        2-144867     6/1990
(Continued)

*Primary Examiner* — Michael Lebentritt
*Assistant Examiner* — Kevin Quinto
(74) *Attorney, Agent, or Firm* — Drinker Reath & Reath LLP

(57) ABSTRACT

Integrated circuit layers to be stacked on top of each other are formed with a plurality of inspection rectifier device units, respectively. The inspection rectifier device units including rectifier devices are connected between a plurality of connection terminals and a positive power supply lead and a grounding lead and emit light in response to a current. After electrically connecting the plurality of connection terminals to each other, a bias voltage is applied between the positive power supply lead and the grounding lead, and the connection state between the connection terminals is inspected according to a light emission of the inspection rectifier device unit. This makes it possible to inspect, in a short time every time a layer is stacked, whether or not an interlayer connection failure exists in a semiconductor integrated circuit device constructed by stacking a plurality of integrated circuit layers in their thickness direction.

14 Claims, 14 Drawing Sheets

(56) References Cited

FOREIGN PATENT DOCUMENTS

| | | |
|---|---|---|
| JP | 2001-135778 | 5/2001 |
| JP | 2003-21666 | 1/2003 |
| JP | 2003-86689 | 3/2003 |
| JP | 2004-281633 | 10/2004 |
| JP | 2004-327474 | 11/2004 |

* cited by examiner

DETECTION METHOD FOR SEMICONDUCTOR INTEGRATED CIRCUIT DEVICE, AND SEMICONDUCTOR INTEGRATED CIRCUIT DEVICE

TECHNICAL FIELD

The present invention relates to a semiconductor integrated circuit device inspection method and a semiconductor integrated circuit device.

BACKGROUND ART

Patent Literature 1 discloses a semiconductor device having a so-called chip-on-chip structure formed by bonding a parent chip and a child chip together. Respective power supply and grounding parts of the parent and child chips are electrically isolated from each other. Diodes (protective or parasitic diodes) are connected in reverse between grounding and signal leads and between power supply and signal leads in each chip. For inspecting whether the connection between signal connection bumps is good or not, test probes are attached to the signal connection bump of the parent chip and the grounding connection bump for supplying a grounding potential to the child chip, so as to apply a test voltage thereto, and it is examined whether or not a circuit is formed through the diodes.

Patent Literature 2 discloses a technique concerning a multilayer module constructed by stacking a plurality of chips. This multilayer module has a plurality of stacked chips and a substrate arranged under the plurality of chips. Each chip has mounting pads and inspection conduction pads on its upper face and mounting terminals, inspection conduction terminals electrically connected to the inspection conduction pads, and inspection signal terminals adjacent to the inspection conduction terminals on its lower face. Inspection connectors to connect with the inspection conduction terminals on the lower face of the chip are arranged on the upper face of the substrate, while mounting terminals and inspection conduction terminals are arranged on the lower face of the substrate. In this multilayer module, an inspection pad of the mounted chip and an inspection terminal of a chip to be stacked are connected to each other, and an inspection signal is fed from the inspection terminal of the mounted chip electrically continuous with the inspection pad, so as to perform a continuity test.

Patent Literature 3 discloses a technique concerning a memory system including a plurality of memory modules as respective memory subsystems. In this memory system, which comprises a plurality of DRAM chips stacked on an IO chip and a through-hole electrode connecting each DRAM chip to the IO chip, a system data signal and an inner data signal within each DRAM are converted into each other by the IO chip.

Patent Literature 4 discloses a technique concerning a program such as a CAD tool for estimating a failure position which is a cause of a reaction from a location of the reaction detected by a luminescent microscope or the like and a failure analysis method using the same. This failure analysis method detects light emitted by a transistor formed within a circuit, so as to narrow the location where the circuit fails.

CITATION LIST

Patent Literature

Patent Literature 1: Japanese Patent Application Laid-Open No. 2001-135778
Patent Literature 2: Japanese Patent Application Laid-Open No. 2004-281633
Patent Literature 3: Japanese Patent Application Laid-Open No. 2004-327474
Patent Literature 4: Japanese Patent Application Laid-Open No. 2003-86689

SUMMARY OF INVENTION

Technical Problem

Though techniques for making semiconductor integrated circuits finer have now advanced dramatically, it has gradually been becoming harder for them to be made further finer. Hence, for further improving the integration density, semiconductor integrated circuit devices in which a number of substrates and layers formed with integrated circuits are stacked in their thickness direction have been under development. Since signals must be exchanged between a plurality of integrated circuit layers, electric connection terminals such as bump electrodes are provided between the integrated circuit layers in this semiconductor integrated circuit device.

In such a semiconductor integrated circuit device, the number of connection terminals for connecting the integrated circuit layers to each other increases as the integrated circuit in each integrated circuit layer is larger in scale. This raises the probability of connection failures occurring, thereby necessitating continuity tests for the connection terminals. In particular, performing a continuity test every time a layer is stacked can effectively prevent a new integrated circuit layer from uselessly being stacked on an integrated circuit layer having a connection failure portion.

A method performing probing for each connection terminal such as the method disclosed in Patent Literature 1, for example, necessitates enormous time and labor for inspection when the semiconductor integrated circuit device has a number of connection terminals. The probing may also produce damages and dust on pad surfaces, thereby causing connection failures, and thus is hard to be employed in inline inspections in which a continuity test is performed every time a layer is stacked.

It is an object of the present invention to provide an inspection method and semiconductor integrated circuit device which can inspect, in a short time every time a layer is stacked, whether or not an interlayer connection failure exists in a semiconductor integrated circuit device constructed by stacking a plurality of integrated circuit layers in their thickness direction.

Solution to Problem

The semiconductor integrated circuit device inspection method in accordance with an embodiment of the present invention is a method for inspecting a semiconductor integrated circuit device constructed by stacking a plurality of integrated circuit layers, each including a support layer having front and rear faces, a semiconductor device group formed on the front face of the support layer, and a wiring layer including a first lead formed on the front face of the support layer, in a thickness direction thereof, the method comprising the steps of forming, when making a first of the integrated circuit layers, on the front face a plurality of first inspection rectifier device units connected between a plurality of connection terminals for electrically connecting with a second of the integrated circuit layers and the first lead and adapted to emit light in response to a current, each of the first inspection rectifier device units including a rectifier device; forming, when making the second integrated circuit layer, on the front face a plurality of second inspection rectifier device units connected between a plurality of connection terminals for electrically connecting with the first integrated circuit layer and the first lead and adapted to emit light in response to a current, each of the second inspection rectifier device units including a rectifier device, while providing a light-transmitting region in the wiring layer on the second inspection rectifier device units, the light-transmitting region having a wiring density lower than that in the remaining region; causing the rear face of the second integrated circuit layer and the first integrated circuit layer to oppose each other when stacking the second integrated circuit layer on top of the first integrated circuit layer; electrically connecting the plurality of connection terminals in the first integrated circuit layer and the plurality of connection terminals in the second integrated circuit layer to each other and then applying a bias voltage to the first and second inspection rectifier device units through the first leads of the first and second integrated circuit layers; and inspecting a connection state between the plurality of connection terminals of the first integrated circuit layer and the plurality of connection terminals of the second integrated circuit layer according to a light emission of the second inspection rectifier device unit observed through the light-transmitting region on the front face side of the second integrated circuit layer.

When making a first of integrated circuit layers, this semiconductor integrated circuit device inspection method connects a first inspection rectifier device unit between each of a plurality of (interlayer) connection terminals and the first lead. Similarly, when making a second of integrated circuit layers, a second inspection rectifier device unit is connected between each of a plurality of (interlayer) connection terminals and the first lead. Each of the first and second inspection rectifier device units includes a rectifier device and emits light in response to a current supplied thereto. In the inspection rectifier device units, the rectifier device itself or a light-emitting device provided separately from the rectifier device may emit light.

After the plurality of connection terminals in the first integrated circuit layer and the plurality of connection terminals in the second integrated circuit layer are electrically connected to each other through bumps, for example, a bias voltage is applied to the first and second inspection rectifier device units through the leads of the first and second integrated circuit layers. If the connection terminals of the first integrated circuit layer and the connection terminals of the second integrated circuit layer are favorably connected to each other here, a current path connecting the first lead of the first integrated circuit layer, the first inspection rectifier device unit, the connection terminal of the first integrated circuit layer, the connection terminal of the second integrated circuit layer, the second inspection rectifier device unit, and the first lead of the second integrated circuit layer in sequence is constructed, whereby the first and second inspection rectifier device units emit light. Then, the light emission of the second inspection rectifier device unit can be observed through the light-transmitting region of the wiring layer. When a connection failure occurs between the connection terminals of the first and second integrated circuit layers, however, the above-mentioned current path is cut off between the connection terminals, whereby the first and second inspection rectifier device units emit no light or fail to achieve a predetermined amount of light emission.

That is, the above-mentioned semiconductor integrated circuit device inspection method can inspect the connection state between the plurality of connection terminals of the first integrated circuit layer and the plurality of connection terminals of the second integrated circuit layer according to the light emission of the second inspection rectifier device unit. Therefore, it can easily determine whether or not there is a connection failure by collectively observing whether or not there is a light emission corresponding to each of a number of connection terminals, thereby making it possible to inspect whether or not there is a connection failure in a short time every time an integrated circuit layer is stacked.

In the semiconductor integrated circuit device inspection method, the first and second inspection rectifier device units may further include a light-emitting device connected in series to the rectifier device. Alternatively, in the semiconductor integrated circuit device inspection method, the rectifier devices of the first and second inspection rectifier device units may emit light in response to a current. Any of these structures can favorably achieve the above-mentioned first and second inspection rectifier device units.

In the semiconductor integrated circuit device inspection method, at least one of the first and second integrated circuit layers may further be formed with a voltage application unit for generating the bias voltage in response to an energy input from outside of the semiconductor integrated circuit device. This can apply the bias voltage without probing, thereby making it possible to further reduce the number of probing operations (or eliminate probing) in the inspection. In this case, the voltage application unit may include a photoelectric transducer for generating an electromotive force in response to light emitted from outside of the semiconductor integrated circuit device. This can favorably achieve the voltage application unit.

The semiconductor integrated circuit device inspection method may be configured such that the first lead of the first integrated circuit layer is one of positive power supply and grounding leads formed on the front face of the support layer so as to supply a power supply voltage to the semiconductor device group, the first lead of the second integrated circuit layer is the other of the positive power supply and grounding leads formed on the front face of the support layer so as to supply the power supply voltage to the semiconductor device group, the rectifier devices of the plurality of first inspection rectifier device units are connected in reverse to the one lead when making the first integrated circuit layer, and the rectifier devices of the plurality of second inspection rectifier device units are connected in reverse to the other lead when making the second integrated circuit layer.

In this inspection method, the rectifier device of the first inspection rectifier device unit is connected in reverse to one of positive power supply and grounding leads in the first integrated circuit layer, so that no current flows in the first inspection rectifier device unit during normal operation. Similarly, the rectifier device of the second inspection rectifier device unit is connected in reverse to the other of positive power supply and grounding leads in the second integrated circuit layer, so that no current flows in the second inspection rectifier device unit during normal operation. Applying an inspection voltage which is in the forward direction to the first and second inspection rectifier device units (i.e., in a polarity opposite to that of the power supply voltage during normal operation) between the one lead of the first integrated circuit layer and the other lead of the second integrated circuit layer at the time of inspection can supply a current to the first and second inspection rectifier device units, so as to make them emit light. Therefore, this inspection method can inspect whether or not there is an interlayer connection failure by utilizing the existing power supply and grounding leads. The first leads of the plurality of integrated circuit layers may also be those provided for inspection independently from the semiconductor device groups.

The semiconductor integrated circuit device in accordance with the present invention is a semiconductor integrated circuit device constructed by stacking a plurality of integrated circuit layers in a thickness direction thereof, each of the integrated circuit layers including a support layer having front and rear faces, a semiconductor device group formed on the front face of the support layer, and a wiring layer including a first lead formed on the front face of the support layer; wherein a first of the integrated circuit layers has a plurality of connection terminals for electrically connecting with a second of the integrated circuit layers and a plurality of first inspection rectifier device units formed on the front face, connected between the respective connection terminals and the first lead, and adapted to emit light in response to a current, each of the first inspection rectifier device units including a rectifier device; wherein the second of the integrated circuit layers has a plurality of connection terminals for electrically connecting with the first integrated circuit layer, a plurality of second inspection rectifier device units formed on the front face, connected between the respective connection terminals and the first lead, and adapted to emit light in response to a current, each of the second inspection rectifier device units including a rectifier device, and a light-transmitting region, formed in the wiring layer on the second inspection rectifier device units, having a wiring density lower than that in the remaining region; wherein the rear face of the second integrated circuit layer and the first integrated circuit layer oppose each other; wherein the plurality of connection terminals of the first integrated circuit layer and the plurality of connection terminals of the second integrated circuit layer are electrically connected to each other; and wherein the semiconductor integrated circuit device further comprises a voltage application unit for applying a bias voltage to the first and second inspection rectifier device units through the first leads of the first and second integrated circuit layers.

In this semiconductor integrated circuit device, a first of integrated circuit layers has a first inspection rectifier device unit connected between each of a plurality of (interlayer) connection terminals and a lead. Similarly, a second of the integrated circuit layers has a second inspection rectifier device unit connected between each of a plurality of (interlayer) connection terminals and a lead. Each of the first and second inspection rectifier device units includes a rectifier device and emits light in response to a current supplied thereto.

The plurality of connection terminals in the first integrated circuit layer and the plurality of connection terminals in the second integrated circuit layer are electrically connected to each other through bumps, for example. Furthermore, the voltage application unit applies a bias voltage to the first and second inspection rectifier device units through the leads of the first and second integrated circuit layers. When the connection terminals of the first integrated circuit layer and the connection terminals of the second integrated circuit layer are favorably connected to each other, the first and second inspection rectifier device units emit light as explained in the above-mentioned inspection method. Then, the light emission of the second inspection rectifier device unit can be observed through the light-transmitting region of the wiring layer. When a connection failure occurs between the connection terminals of the first and second integrated circuit layers, however, the first and second inspection rectifier device units emit no light.

That is, the above-mentioned semiconductor integrated circuit device can inspect the connection state between the plurality of connection terminals of the first integrated circuit layer and the plurality of connection terminals of the second integrated circuit layer according to the light emission of the second inspection rectifier device unit. Therefore, it can easily determine whether or not there is a connection failure by collectively observing whether or not there is a light emission corresponding to each of a number of connection terminals, thereby making it possible to inspect whether or not there is a connection failure in a short time every time an integrated circuit layer is stacked.

In the semiconductor integrated circuit device, the first and second inspection rectifier device units may further include a light-emitting device connected in series to the rectifier device. Alternatively, in the semiconductor integrated circuit device, the rectifier devices of the first and second inspection rectifier device units may emit light in response to a current. Any of these structures can favorably achieve the first and second inspection rectifier device units.

In the semiconductor integrated circuit device, the voltage application unit may be provided with at least one of the first and second integrated circuit layers and generate the bias voltage in response to an energy input from outside of the semiconductor integrated circuit device. This can apply the bias voltage without probing, thereby making it possible to further reduce the number of probing operations (or eliminate probing) in the inspection. In this case, the voltage application unit may include a photoelectric transducer for generating an electromotive force in response to light emitted from outside of the semiconductor integrated circuit device. This can favorably achieve the voltage application unit.

The semiconductor integrated circuit device may be configured such that the first lead of the first integrated circuit layer is one of positive power supply and grounding leads formed on the front face of the support layer so as to supply a power supply voltage to the semiconductor device group, the first lead of the second integrated circuit layer is the other of the positive power supply and grounding leads formed on the front face of the support layer so as to supply the power supply voltage to the semiconductor device group, the rectifier devices of the plurality of first inspection rectifier device units are connected in reverse to the one lead, and the rectifier devices of the plurality of second inspection rectifier device units are connected in reverse to the other lead.

In this semiconductor integrated circuit device, the rectifier device of the first inspection rectifier device unit is connected in reverse to one of positive power supply and grounding leads in the first integrated circuit layer, so that no current flows in the first inspection rectifier device unit during normal operation. Similarly, the rectifier device of the second inspection rectifier device unit is connected in reverse to the other of positive power supply and grounding leads in the second integrated circuit layer, so that no current flows in the second inspection rectifier device unit during normal operation. Applying an inspection voltage which is in the forward direction to the first and second inspection rectifier device units (i.e., in a polarity opposite to that of the power supply voltage during normal operation) between the one lead of the first integrated circuit layer and the other lead of the second integrated circuit layer at the time of inspection can supply a current to the first and second inspection rectifier device units, so as to make them emit light. Therefore, this semiconductor integrated circuit device can inspect whether or not there is an interlayer connection failure by utilizing the existing power supply and grounding leads. The first leads of the plurality of integrated circuit layers may also be those provided for inspection independently from the semiconductor device groups.

Advantageous Effects of Invention

The present invention can inspect, in a short time every time a layer is stacked, whether or not an interlayer connection failure exists in a semiconductor integrated circuit device constructed by stacking a plurality of integrated circuit layers in their thickness direction.

DESCRIPTION OF EMBODIMENTS

Figure 1:
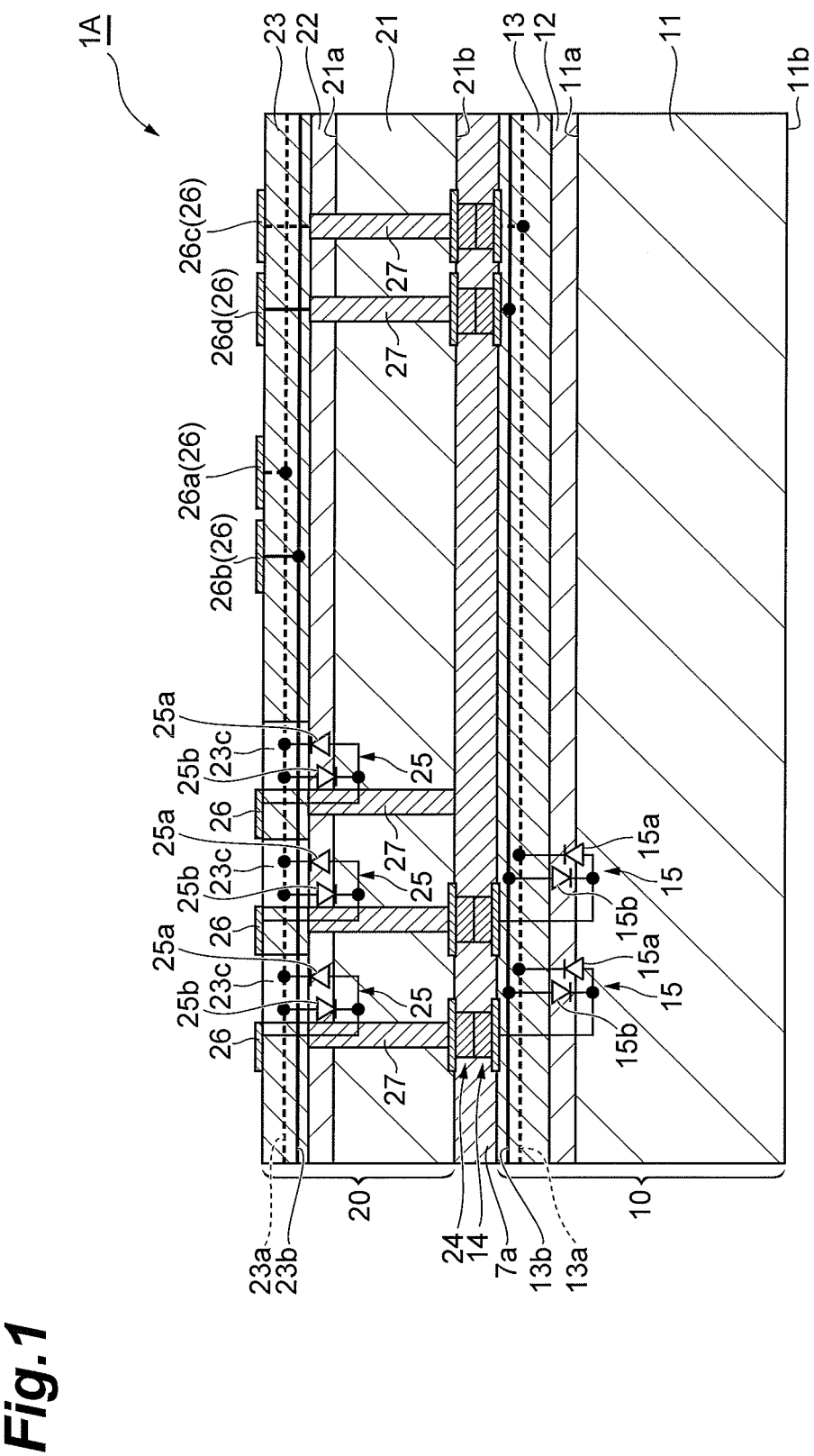
FIG. 1 is a sectional view illustrating the structure of a first embodiment of the semiconductor integrated circuit device in accordance with the present invention.

In the following, embodiments of the semiconductor integrated circuit device inspection method and semiconductor integrated circuit device in accordance with the present invention will be explained in detail with reference to the accompanying drawings. In the drawings, the same or equivalent parts will be referred to with the same signs while omitting their overlapping descriptions.

First Embodiment

FIG. 1 is a sectional view illustrating the structure of the first embodiment of the semiconductor integrated circuit device. As illustrated in FIG. 1, the semiconductor integrated circuit device 1A of this embodiment is constructed by stacking a first integrated circuit layer 10 and a second integrated circuit layer 20 in the thickness direction. In this embodiment, the first and second integrated circuit layers 10, 20 are joined to each other such that a front face (device formation surface) 11a of a semiconductor substrate 11 in the integrated circuit layer 10 and a rear face 21b of a semiconductor substrate 21 in the integrated circuit layer 20 oppose each other.

The integrated circuit layer 10 comprises the semiconductor substrate 11 having the front face 11a and rear face 11b, a device layer 12 disposed on the front face 11a of the semiconductor substrate 11, a wiring layer 13 disposed on the device layer 12, and a plurality of connection terminals (electrodes) 14 for electrically connecting with the integrated circuit layer 20. Similarly, the integrated circuit layer 20 comprises the semiconductor substrate 21 having the front face 21a and rear face 21b, a device layer 22 disposed on the front face 21a of the semiconductor substrate 21, a wiring layer 23 disposed on the device layer 22, and a plurality of connection terminals (electrodes) 24 for electrically connecting with the integrated circuit layer 10.

The semiconductor substrates 11, 21 are made of silicon, for example. The semiconductor substrates 11, 21 are support layers for the integrated circuit layers 10, 20. Each of the device layers 12, 22 includes a semiconductor device group constituted by a plurality of semiconductor devices such as transistors, for example. The plurality of semiconductor devices are formed through a semiconductor process such as ion implantation on the front faces 11a, 21a of the semiconductor substrates 11, 21. The plurality of semiconductor devices may also be those formed by epitaxially growing semiconductor crystals on the semiconductor substrates 11, 21. The plurality of semiconductor devices may also be those formed by a semiconductor process such as ALD (Atomic Layer Deposition), for example, which does not use the ion implantation.

The wiring layers 13, 23 include a plurality of leads for electrically connecting a plurality of semiconductor devices included in the device layers 12, 22 to each other. The plurality of leads include not only signal leads for connecting the semiconductor devices to each other, but also positive power supply leads 13a, 23a and grounding leads 13b, 23b for applying a power supply voltage to the plurality of semiconductor devices. The positive power supply leads 13a, 23a and grounding leads 13b, 23b are first leads in this embodiment. In this embodiment, the positive power supply lead 13a and grounding lead 13b of the integrated circuit layer 10 and the positive power supply lead 23a and grounding lead 23b of the integrated circuit layer 20 are arranged independently from each other and not mutually connected at the time of inspection.

The wiring layer 23 is provided with a plurality of light-transmitting regions 23c. The plurality of light-transmitting regions 23c are disposed at respective parts of the wiring layer 23 located on a plurality of inspection rectifier device units 15 which will be explained later. The light-transmitting regions 23c have a wiring density lower than that of the remaining region in the wiring layer 23, so as to transmit therethrough light from the inspection rectifier device unit 15 to the outside of the semiconductor integrated circuit device 1A. Preferably, the light-transmitting regions 23c are free of wiring.

The plurality of connection terminals 14 are disposed on the wiring layer 13. The plurality of connection terminals 24 are disposed on the rear face 21b of the substrate 21. The plurality of connection terminals 14 in the integrated circuit layer 10 and the plurality of connection terminals 24 in the integrated circuit layer 20 are arranged on the front face 11a and rear face 21b at such positions as to oppose each other, while coming into contact with each other, so as to connect with each other electrically. Each of the plurality of connection terminals 14, 24 is favorably constituted by a bump electrode, for example.

The integrated circuit layer 10 further comprises a plurality of first inspection rectifier device units 15. The plurality of inspection rectifier device units 15 are formed in the device layer 12 and correspond one-to-one to the plurality of connection terminals 14 for the signal leads. Each of the plurality of inspection rectifier device units 15 has rectifier devices 15a, 15b. An example of the rectifier devices 15a, 15b are diodes. The rectifier device 15a is connected in reverse between the positive power supply lead 13a and connection terminal 14 of the integrated circuit layer 10, while the rectifier device 15b is connected in reverse between the grounding lead 13b and connection terminal 14 of the integrated circuit layer 10. More specifically, the cathode of the rectifier device 15a and the positive power supply lead 13a are connected to each other, while the anode of the rectifier device 15a and the connection terminal 14 are connected to each other. The anode of the rectifier device 15b and the grounding lead 13b are connected to each other, while the cathode of the rectifier device 15b and the connection terminal 14 are connected to each other. For easier understanding, FIG. 1 explicitly shows circuit symbols of the rectifier devices (diodes) 15a, 15b.

The inspection rectifier device unit 15 has a structure for emitting light in response to a current. Such a structure can be achieved more favorably if the rectifier devices 15a, 15b emit light themselves in response to a current, for example. It can also be achieved favorably if the inspection rectifier device unit 15 further comprises two light-emitting devices connected in series to the rectifier devices 15a, 15b, respectively.

The integrated circuit layer 20 further comprises a plurality of second inspection rectifier device units 25. The plurality of inspection rectifier device units 25 are formed in the device layer 22 and correspond one-to-one to the plurality of connection terminals 24 for the signal leads. Each of the plurality of inspection rectifier device units 25 has rectifier devices 25a, 25b. An example of the rectifier devices 25a, 25b are diodes. The rectifier device 25a is connected in reverse between the positive power supply lead 23a and connection terminal 24 of the integrated circuit layer 20, while the rectifier device 25b is connected in reverse between the grounding lead 23b and connection terminal 24 of the integrated circuit layer 20. More specifically, the cathode of the rectifier device 25a and the positive power supply lead 23a are connected to each other, while the anode of the rectifier device 25a and the connection terminal 24 are connected to each other through a through-silicon via (TSV) 27. The anode of the rectifier device 25b and the grounding lead 23b are connected to each other, while the cathode of the rectifier device 25b and the connection terminal 24 are connected to each other through the TSV 27. For easier understanding, FIG. 1 explicitly shows circuit symbols of the rectifier devices (diodes) 25a, 25b. A plurality of TSVs 27, which are leads for connecting leads of the wiring layer 23 on the front face 21a of the semiconductor substrate 21 and the plurality of connection terminals 24 on the rear face 21b to each other, are disposed within the semiconductor substrate 21.

The inspection rectifier device unit 25 has a structure for emitting light in response to a current. Such a structure can be achieved more favorably if the rectifier devices 25a, 25b emit light themselves in response to a current. It can also be achieved favorably if the inspection rectifier device unit 25 further comprises two light-emitting devices connected in series to the rectifier devices 25a, 25b, respectively.

Figure 2:
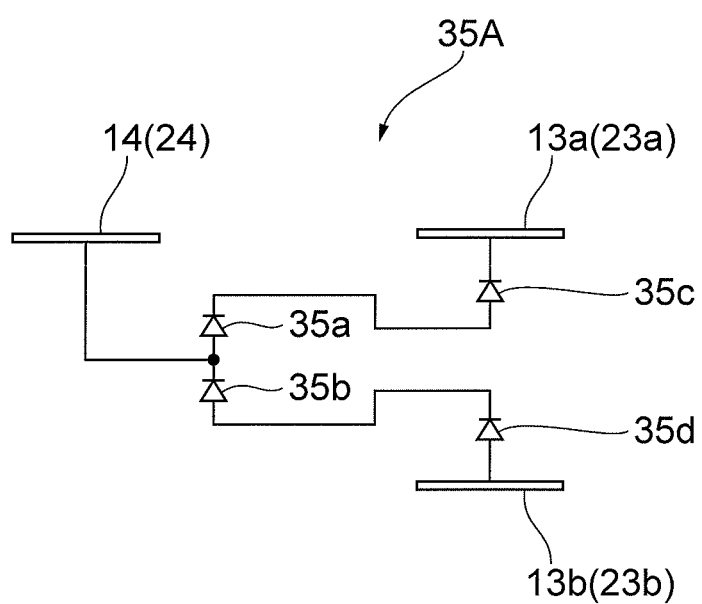
FIG. 2 is a diagram illustrating the structure of an inspection rectifier device unit.

An inspection rectifier device unit having light-emitting devices connected in series to rectifier devices will now be explained by way of example. FIG. 2 is a diagram illustrating the structure of an inspection rectifier device unit 35A. This inspection rectifier device unit 35A is replaceable with the inspection rectifier device units 15 and 25 illustrated in FIG. 1.

As illustrated in FIG. 2, the inspection rectifier device unit 35A has a rectifier device 35a connected in reverse between the connection terminal 14 or 24 and the positive power supply lead 13a or 23a and a light-emitting diode 35c as a light-emitting device connected in series to the rectifier device 35a. The inspection rectifier device unit 35A also has a rectifier device 35b connected in reverse between the connection terminal 14 or 24 and the grounding lead 13b or 23b and a light-emitting diode 35d as a light-emitting device connected in series to the rectifier device 35b.

Reference will be made to FIG. 1 again. The integrated circuit layer 20 has a plurality of connection terminals (electrodes) 26 on the wiring layer 23 for electrically connecting with the integrated circuit layer further stacked on the integrated circuit layer 20. One connection terminal 26a in the plurality of connection terminals 26 is electrically connected to the positive power supply lead 23a of the integrated circuit layer 20. One connection terminal 26b in the plurality of connection terminals 26 is electrically connected to the grounding lead 23b of the integrated circuit layer 20. One connection terminal 26c in the plurality of connection terminals 26 is electrically connected to the positive power supply lead 13a of the integrated circuit layer 10 through the TSV 27 and connection terminals 24, 14. One connection terminal 26d in the plurality of connection terminals 26 is electrically connected to the grounding lead 13b of the integrated circuit layer 10 through the TSV 27 and connection terminals 24, 14. Thus, the connection terminals 26a to 26d are provided in order to arrange respective power supply lines of the integrated circuit layers 10, 20 independently from each other in this embodiment. The connection terminals 26a to 26d and the TSVs 27 connected to the connection terminals 26c, 26d constitute a voltage application unit for applying a bias voltage to the inspection rectifier device units 15, 25 through the positive power supply lead 13a (or grounding lead 13b) of the integrated circuit layer 10 and the grounding lead 23b (or positive power supply lead 23a) of the integrated circuit layer 20.

The semiconductor integrated circuit device 1A further comprises an adhesive layer 7a. The adhesive layer 7a is disposed in a gap between the integrated circuit layers 10, 20 and mechanically bonds them together. The adhesive layer 7a preferably includes a material which can block light from the inspection rectifier device units 15.

Figure 3:
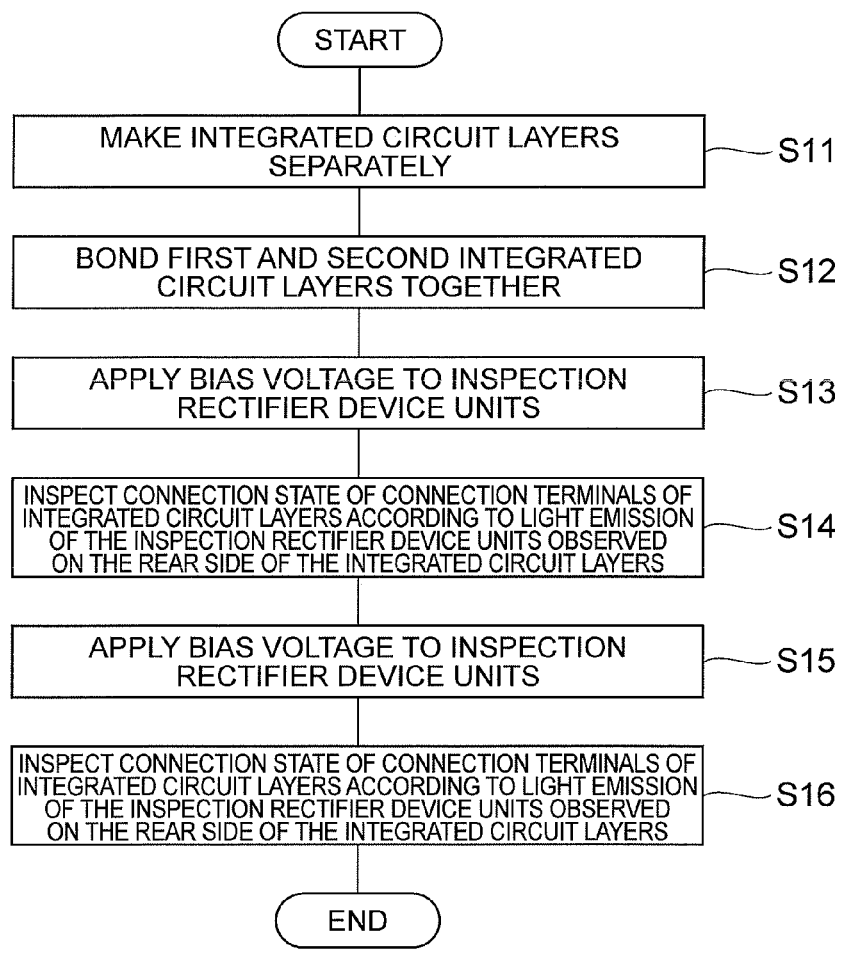
FIG. 3 is a flowchart illustrating a semiconductor integrated circuit device inspection method.

An inspection method of the semiconductor integrated circuit device 1A explained in the foregoing will now be explained. FIG. 3 is a flowchart illustrating this inspection method.

First, the integrated circuit layers 10, 20 are made individually (integrated circuit layer formation step S11). Specifically, the semiconductor substrate 11 for the integrated circuit layer 10 is prepared, and the device layer 12 is formed on the front face 11a of the semiconductor substrate 11. Here, the inspection rectifier device units 15 (rectifier devices 15a, 15b) are formed in the device layer 12 together with the semiconductor device group. Subsequently, the wiring layer 13 is formed on the device layer 12. Here, the plurality of connection terminals 14 for electrically connecting with the integrated circuit layer 20, the positive power supply lead 13a, and the grounding lead 13b are formed within or on the wiring layer 13. Also, a lead is formed to connect with the rectifier device 15a between the connection terminal 14 and the positive power supply lead 13a, and a lead is formed to connect with the rectifier device 15b between the connection terminal 14 and the grounding lead 13b. In this step S11, it is desirable to perform an operation test of the integrated circuit layer 10, so as to check to see if the semiconductor device group of the device layer 12 has no abnormality.

The integrated circuit layer 20 is formed as with the integrated circuit layer 10. That is, the semiconductor substrate 21 for the integrated circuit layer 20 is prepared, and the device layer 22 is formed on the front face 21a of the semiconductor substrate 21. Here, the inspection rectifier device units 25 (rectifier devices 25a, 25b) are formed in the device layer 22 together with the semiconductor device group. Subsequently, the wiring layer 23 is formed on the device layer 22. Here, the plurality of connection terminals 24 for electrically connecting with the integrated circuit layer 10, the positive power supply lead 23a, and the grounding lead 23b are formed within or on the wiring layer 23. Also, a lead is formed to connect with the rectifier device 25a between the connection terminal 24 and the positive power supply lead 23a, and a lead is formed to connect with the rectifier device 25b between the connection terminal 24 and the grounding lead 23b. Further, a plurality of light-transmitting regions 23c are formed in the wiring layer 23. In this step S11, it is desirable to perform an operation test of the integrated circuit layer 20, so as to check to see if the semiconductor device group of the device layer 22 has no abnormality.

Next, the integrated circuit layers 10, 20 are bonded together (bonding step S12). That is, the integrated circuit layers 10, 20 are attached to each other through the adhesive layer 7a such that the front face 11a of the semiconductor substrate 11 and the rear face 21b of the semiconductor substrate 21 oppose each other. Simultaneously, the plurality of connection terminals 14 of the integrated circuit layer 10 and the plurality of connection terminals 24 of the integrated circuit layer 20 are joined to each other, so as to be electrically connected to each other. In this bonding step, each of the integrated circuit layers 10, 20 may be a single chip cut from a wafer, an assembly containing a plurality of chips, or in the state of a wafer before cutting.

Subsequently, a bias voltage is applied to the inspection rectifier device units 15, 25 (first inspection voltage application step S13). That is, an inspection bias voltage having a positive potential on the grounding lead 23b side is applied between the positive power supply lead 13a of the integrated circuit layer 10 and the grounding lead 23b of the integrated circuit layer 20 through probes brought into contact with the connection terminals 26b, 26c, respectively. As a consequence, a forward bias voltage is applied to the rectifier device 15a of the inspection rectifier device unit 15 and the rectifier device 25b of the inspection rectifier device unit 25. Hence, a forward current flows in the rectifier devices 15a, 25b, so that the rectifier devices 15a, 25b (or other light-emitting devices connected in series thereto) emit light if the connection between the connection terminals 14, 24 is normal. This light is transmitted through the light-transmitting regions 23c of the wiring layer 23, so as to be emitted to the outside of the semiconductor integrated circuit device 1A.

Then, according to the light emission of the inspection rectifier device unit 25 observed on the front face 21a side of the integrated circuit layer 20, the connection state between a plurality of connection terminals 14 of the integrated circuit layer 10 and a plurality of connection terminals 24 of the integrated circuit layer 20 is inspected (first inspection step S14). Specifically, an image of the semiconductor integrated circuit device 1A is captured from the front face 21a side of the integrated circuit layer 20. Then, a bright point (the light emission of the inspection rectifier device unit 25) on the image data and a bright point on a reference data concerning a light emission position of the inspection rectifier device unit 25 prepared beforehand are compared with each other. When the inspection rectifier device unit 25 does not emit light or fails to achieve a predetermined amount of light emission at the position to emit light as a result of the comparison, it is determined that there is a connection failure between the inspection rectifier device unit 25 and its corresponding connection terminal 24.

Next, a bias voltage is applied to the inspection rectifier device units 15, 25 (second inspection voltage application step S15). That is, an inspection bias voltage having a positive potential on the grounding lead 13b side is applied between the grounding lead 13b of the integrated circuit layer 10 and the positive power supply lead 23a of the integrated circuit layer 20 through probes brought into contact with the connection terminals 26a, 26d, respectively. As a consequence, a forward bias voltage is applied to the rectifier device 15b of the inspection rectifier device unit 15 and the rectifier device 25a of the inspection rectifier device unit 25. Hence, a forward current flows in the rectifier devices 15b, 25a, so that the rectifier devices 15b, 25a (or other light-emitting devices connected in series thereto) emit light if the connection between the connection terminals 14, 24 is normal.

Then, according to the light emission of the inspection rectifier device unit 25 observed on the front face 21a side of the integrated circuit layer 20, the connection state between a plurality of connection terminals 14 of the integrated circuit layer 10 and a plurality of connection terminals 24 of the integrated circuit layer 20 is inspected (second inspection step S16). Specifically, an image of the semiconductor integrated circuit device 1A is captured from the front face 21a side of the integrated circuit layer 20. Then, a bright point (the light emission of the inspection rectifier device unit 25) on the image data and a bright point on a reference data concerning a light emission position of the inspection rectifier device unit 25 prepared beforehand are compared with each other. When the inspection rectifier device unit 25 does not emit light or fails to achieve a predetermined amount of light emission at the position to emit light as a result of the comparison, it is determined that there is a connection failure between the inspection rectifier device unit 25 and its corresponding connection terminal 24.

When comparing the image data and the reference data with each other, it is necessary for their position to align with each other. Therefore, the light emission image from the inspection rectifier device unit 25 and the front face pattern image of the integrated circuit in the integrated circuit layer 20 are preferably acquired sequentially or simultaneously, so as to align the layout data of the integrated circuit layer 20 and the front face pattern image with each other. The light emission image from the inspection rectifier device unit 25 may be acquired alone, so as to compare the light emission position with a data concerning a characteristic arrangement of the light emission position, thereby achieving the alignment.

The inspection method of this embodiment may perform one of the combinations of steps S13 and S14 and steps S15 and S16 alone. In other words, the inspection rectifier device units 15, 25 may respectively have the rectifier devices 15a, 25b or the rectifier devices 15b, 25a alone. The captured image data obtained in steps S13 and S14 may be compared with each other (or superposed on each other), and the resulting comparison data (or superposition data) may be compared with the reference data, so as to inspect whether or not there is a connection failure. When the rectifier devices 15a, 15b are located close to each other, for example, the light from the rectifier device 15a and the light from the rectifier device 15b may be observed together, so as to increase the reliability of captured image data.

Effects obtained by the inspection method of the semiconductor integrated circuit device 1A and semiconductor integrated circuit device 1A in accordance with this embodiment explained in the foregoing will now be explained together with problems of the prior art.

In recent years, for further improving the integration density of circuits, semiconductor integrated circuit devices in which a number of substrates and layers formed with integrated circuits are stacked in their thickness direction have been under development. In such semiconductor integrated circuit devices, electric (interlayer) connection terminals such as bump electrodes are provided between the integrated circuit layers. The number of connection terminals increases as the integrated circuit of each integrated circuit layer is larger in scale, thereby necessitating continuity tests for the connection terminals. It is also desirable to analyze causes of connection failures in parallel with the manufacturing of semiconductor integrated circuit devices and feed back them to the manufacturing technology.

After completing a semiconductor integrated circuit, however, interlayer connection terminals are hidden within its multilayer structure, so that locations where connection failures occur cannot be specified easily. Therefore, the locations incurring connection failures can be specified if a continuity test of interlayer connection terminals can be preformed every time an integrated circuit layer is stacked. Further, it can effectively prevent a new integrated circuit layer from uselessly being stacked on an integrated circuit layer having a connection failure location.

The above-mentioned inspection method of the semiconductor integrated circuit device 1A in accordance with this embodiment electrically connects a plurality of connection terminals 14 of the integrated circuit layer 10 and a plurality of connection terminals 24 of the integrated circuit layer 20 to each other through bumps, for example, and then applies a bias voltage to the inspection rectifier device units 15, 25 through the positive power supply lead 13a (or grounding lead 13b) of the integrated circuit layer 10 and the grounding lead 23b (or positive power supply lead 23a) of the integrated circuit layer 20. If the connection terminals 14 of the integrated circuit layer 10 and the connection terminals 24 of the integrated circuit layer 20 are favorably connected to each other here, a current path connecting the positive power supply lead 13a (or grounding lead 13b) of the integrated circuit layer 10, the inspection rectifier device unit 15, the connection terminal 14 of the integrated circuit layer 10, the connection terminal 24 of the integrated circuit layer 20, the inspection rectifier device unit 25, and the grounding lead 23b (or positive power supply lead 23a) of the integrated circuit layer 20 in sequence is constructed.

Therefore, the magnitude of the current flowing through this current path is inversely proportional to the total of the resistance values in the positive power supply lead 13a (or grounding lead 13b) and the grounding lead 23b (or positive power supply lead 23a), the resistance values of the connection terminals 14, 24, and the resistance values of the inspection rectifier device units 15, 25. Typically, the resistance values of the power supply and grounding leads are much lower than those of interlayer connection terminals, while the resistance values of inspection rectifier device units (rectifier devices) have been known. Therefore, the amounts of light emissions in the inspection rectifier device units 15, 25 mainly depend on the resistance values of the connection terminals 14, 24, so that the inspection rectifier device units 15, 25 will not emit light if the connection terminals 14, 24 are not in contact with each other (i.e., the resistance value therebetween is infinite). Hence, seeing whether or not the inspection rectifier device units 15, 25 emit light can detect connection failures between the connection terminals 14, 24, and observing the amount of light emission can estimate the resistance value between the connection terminals 14, 24.

That is, the above-mentioned inspection method of the semiconductor integrated circuit device 1A and semiconductor integrated circuit device 1A can inspect connection states between a plurality of connection terminals 14 of the integrated circuit layer 10 and a plurality of connection terminals 24 of the integrated circuit layer 20 according to the light emission of the inspection rectifier device unit 25. Therefore, collectively seeing whether or not there is a light emission corresponding to each of a number of connection terminals 14, 24 can easily determine whether or not there is a connection failure, so that whether or not a connection failure exists can be inspected in a shorter time every time an integrated circuit layer is stacked as compared with a conventional method of sequentially inspecting a plurality of terminals by probing.

When stacking three or more integrated circuit layers, performing an inspection by probing every time an integrated circuit layer is stacked may allow damages, irregularities, dust, and the like on pads to cause failures in subsequent stacking steps. This embodiment can remarkably decrease the number of probing operations per stacking and thus can reduce connection failures themselves.

This embodiment can easily inspect whether or not there is a connection failure every time an integrated circuit layer is stacked, thereby making it possible to prevent a normal integrated circuit layer from uselessly being stacked on an integrated circuit layer having incurred a connection failure. It can easily detect connection failure locations inline, so as to accelerate the feedback for improving integrated circuit layers, thereby increasing the yield.

Preferably, as in this embodiment, the lead for applying the inspection bias voltage to the inspection rectifier device unit 15 is the positive power supply lead 13a for supplying the power supply voltage to the semiconductor device group in the device layer 12, while the lead for supplying the inspection bias voltage to the inspection rectifier device unit 25 is the grounding lead 23b for supplying the power supply voltage to the semiconductor device group in the device layer 22. Preferably, in this case, the rectifier device 15a of the inspection rectifier device unit 15 is connected in reverse to the positive power supply lead 13a, while the rectifier device 25b of the inspection rectifier device unit 25 is connected in reverse to the grounding lead 23b.

Preferably, as an alternative, the lead for applying the inspection bias voltage to the inspection rectifier device unit 15 is the grounding lead 13b for supplying the power supply voltage to the semiconductor device group in the device layer 12, while the lead for supplying the inspection bias voltage to the inspection rectifier device unit 25 is the positive power supply lead 23a for supplying the power supply voltage to the semiconductor device group in the device layer 22. Preferably, in this case, the rectifier device 15b of the inspection rectifier device unit 15 is connected in reverse to the grounding lead 13b, while the rectifier device 25a of the inspection rectifier device unit 25 is connected in reverse to the positive power supply lead 23a.

When the semiconductor integrated circuit device 1A has any of the structures mentioned above, the rectifier devices 15a, 15b of the inspection rectifier device unit 15 are connected in reverse to the positive power supply and grounding leads 13a, 13b, respectively, in the integrated circuit layer 10, whereby no current flows in the inspection rectifier device unit 15 during normal operation. Similarly, the rectifier devices 25a, 25b of the inspection rectifier device unit 25 are connected in reverse to the positive power supply and grounding leads 23a, 23b, respectively, in the integrated circuit layer 20, whereby no current flows in the inspection rectifier device unit 25 during normal operation. Applying an inspection voltage which is in the forward direction to the inspection rectifier device units 15, 25 (i.e., in a polarity opposite to that of the power supply voltage during normal operation) through the positive power supply and grounding leads 13a, 23b or the grounding and positive power supply leads 13b, 23a at the time of inspection can supply a current to the inspection rectifier device units 15, 25, so as to make them emit light. Therefore, the semiconductor integrated circuit device 1A having the above-mentioned structure can inspect whether or not there is an interlayer connection failure by utilizing the existing power supply and grounding leads.

Figure 4:
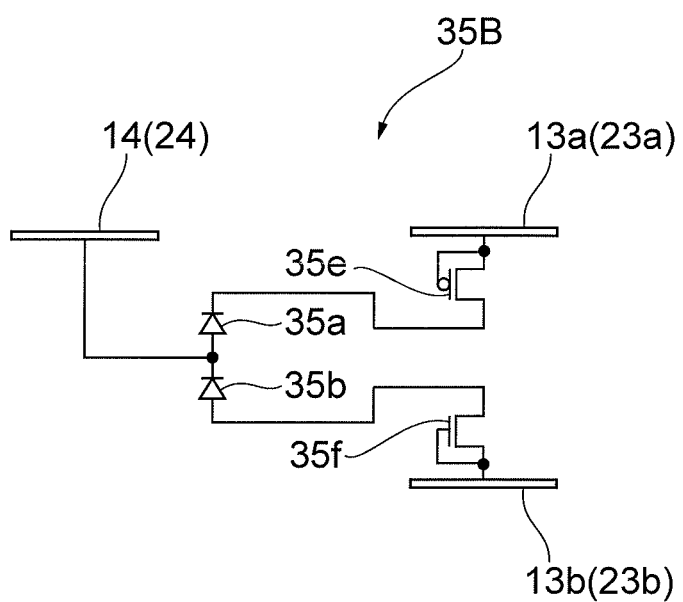
FIG. 4 is a diagram illustrating the structure of an inspection rectifier device unit.

While FIG. 2 illustrates an example of structures having light-emitting devices connected in series to rectifier devices concerning the inspection rectifier device units 15, 25, the light-emitting devices are not limited to light-emitting diodes. For example, FIG. 4 is a diagram illustrating the structure of an inspection rectifier device unit 35B. This inspection rectifier device unit 35B is replaceable with the inspection rectifier device units 15, 25 illustrated in FIG. 1. As illustrated in FIG. 4, the inspection rectifier device unit 35B has a rectifier device 35a and a light-emitting transistor 35e as a light-emitting device connected in series to the rectifier device 35a. The inspection rectifier device unit 35B also has a rectifier device 35b and a light-emitting transistor 35f as a light-emitting device connected in series to the rectifier device 35b.

Figure 5:
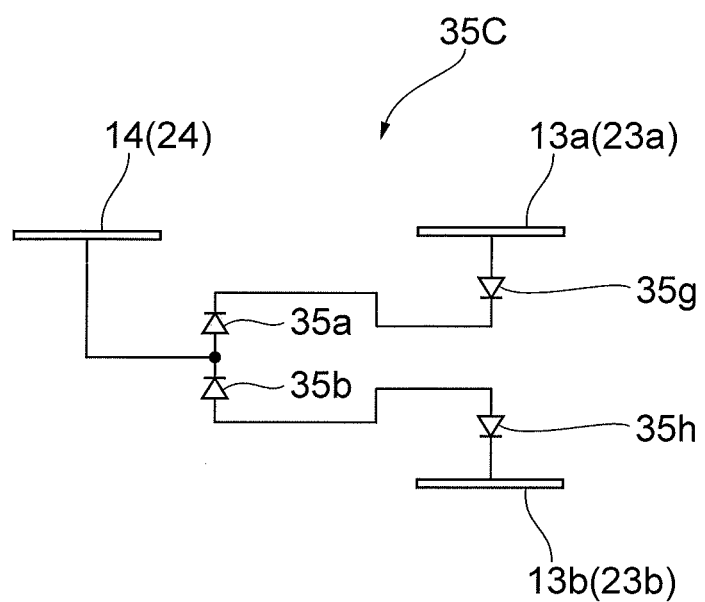
FIG. 5 is a diagram illustrating the structure of an inspection rectifier device unit.

FIG. 5 is a diagram illustrating the structure of an inspection rectifier device unit 35C. This inspection rectifier device unit 35C is replaceable with the inspection rectifier device units 15, 25 illustrated in FIG. 1. As illustrated in FIG. 5, the inspection rectifier device unit 35C has a rectifier device 35a and a low-voltage diode 35g as a light-emitting device connected in series to the rectifier device 35a and forwardly between the connection terminal 14 or 24 and the positive power supply lead 13a or 23a. The inspection rectifier device unit 35C also has a rectifier device 35b and a low-voltage diode 35h as a light-emitting device connected in series to the rectifier device 35b and forwardly between the connection terminal 14 or 24 and the grounding lead 13b or 23b.

Figure 6:
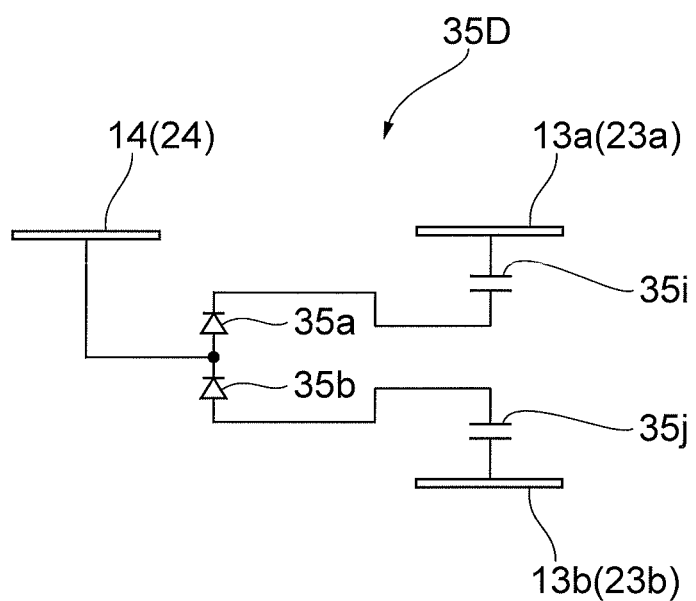
FIG. 6 is a diagram illustrating the structure of an inspection rectifier device unit.

FIG. 6 is a diagram illustrating the structure of an inspection rectifier device unit 35D. This inspection rectifier device unit 35D is replaceable with the inspection rectifier device units 15, 25 illustrated in FIG. 1. As illustrated in FIG. 6, the inspection rectifier device unit 35D has a rectifier device 35a and a tunneling current capacitor 35i as a light-emitting device connected in series to the rectifier device 35a. The inspection rectifier device unit 35D also has a rectifier device 35b and a tunneling current capacitor 35j as a light-emitting device connected in series to the rectifier device 35b.

Though it is desirable for rectifier devices to be arranged very close to the connection terminals and TSVs in order to reduce the additional capacity caused by adding inspection rectifier devices, the connection terminals and TSVs may hinder light emissions from being detected. Hence, providing light-emitting devices separately from the rectifier devices as illustrated in FIGS. 2 and 4 to 6 allows the light-emitting devices to be separated from the TSVs and connection terminals, whereby the light emissions are easier to observe. Any of semiconductor devices which emit light in response to a current can be employed as the light-emitting devices. The light-emitting devices may have light emission wavelengths different from each other.

The following devices are preferred as the rectifier devices 15a and 15b, 25a and 25b, and 35a and 35b. By the rectifier devices are meant herein devices (diodes, transistors, thyristors, and the like) having a junction structure through which a current flows in nonlinear response to a bias voltage. Examples of such a junction structure include a p-n junction which is a junction between a p-type semiconductor and an n-type semiconductor, a junction between a p-type semiconductor and an i (intrinsic)-type semiconductor, a junction between an i-type semiconductor and an n-type semiconductor, a p-i-n junction in which an i-type semiconductor is held between a p-type semiconductor and an n-type semiconductor, a Schottky junction between a semiconductor and a metal, and a tunnel junction holding a thin insulating film, void, or point-contact part, through which a tunnel current flows, in a boundary part. The most preferred among them is the p-n junction. The light emissions in the p-n and p-i-n junctions under forward biasing are mainly recombination emissions, while the light emissions in the p-n and p-i-n junctions under reverse biasing and the light emissions from channels of MOS transistors are mainly hot-carrier emissions. In the tunnel junction, both hot-carrier and recombination emissions can occur. As the rectifier device in this embodiment, a p-n diode also having a light-emitting function is the most preferred.

In a tunnel junction device, there is a case where its forward current and reverse current have substantially the same magnitude. However, the tunnel junction has such a characteristic that no current flows therein under low bias, while a large current flows therein under high bias. Therefore, it can be configured such that a current flows when a high voltage is applied during an inspection, while no current flows under a normal condition of use. At the tunnel junction part, a hot-carrier emission corresponding to the applied voltage difference occurs, and a recombination emission also occurs when one of semiconductors constituting the tunnel junction part is of the p type while the other is of the n type. Hence, it can be used as a rectifier device also having a light-emitting function or a light-emitting device.

In the inspection method of the semiconductor integrated circuit device 1A in accordance with this embodiment, the inspection rectifier device unit 15 of the integrated circuit layer 10 and the inspection rectifier device unit 25 of the integrated circuit layer 20 emit light simultaneously, while the wiring layer 13 of the integrated circuit layers 10 exists between the inspection rectifier device units 15, 25. Also, bumps as the connection terminals 14, 24 and the like exist between the integrated circuit layers 10, 20. Therefore, light from the inspection rectifier device unit 15 is blocked by the wiring layer 13 and connection terminals 14, 24, so as to be less likely to hinder the light from the inspection rectifier device unit 25 from being observed. The wiring density distribution and wiring form may be contrived in the wiring layer 13, so as to block these kinds of light effectively. Materials and components of the adhesive layer 7a may also be selected such as to block these kinds of light effectively.

Second Embodiment

Figure 7:
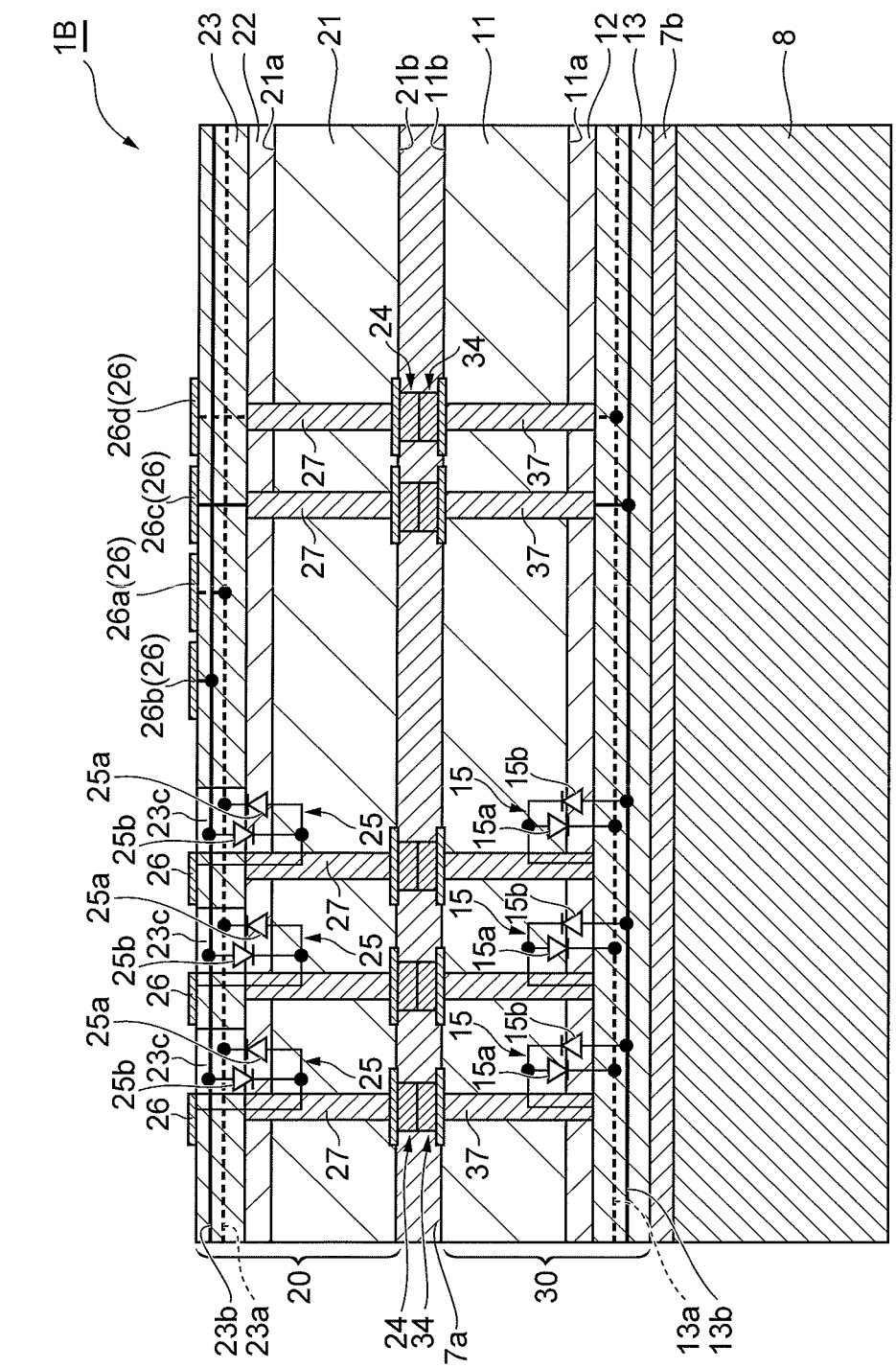
FIG. 7 is a sectional view illustrating the structure of a semiconductor integrated circuit device as a second embodiment.

FIG. 7 is a sectional view illustrating the structure of a semiconductor integrated circuit device 1B as the second embodiment. The semiconductor integrated circuit device 1B in accordance with this embodiment comprises integrated circuit layers 20, 30. In this embodiment, the integrated circuit layers 20, 30 are joined together such that the rear face 11b of the semiconductor substrate 11 in the integrated circuit layer 30 and the rear face 21b of the semiconductor substrate 21 in the integrated circuit layer 20 oppose each other. The integrated circuit layer 30 is structurally the same as the integrated circuit layer 10 of the first embodiment except for structures which will follow.

The integrated circuit layer 30 comprises the semiconductor substrate (support layer) 11 having the front face 11a and rear face 11b, a device layer 12 disposed on the front face 11a of the semiconductor substrate 11, a wiring layer 13 disposed on the device layer 12, and a plurality of connection terminals (electrodes) 34 for electrically connecting with the integrated circuit layer 20. A plurality of leads in the wiring layer 13 include positive power supply and grounding leads 13a, 13b for applying a power supply voltage to a plurality of semiconductor devices.

The plurality of connection terminals 34 are disposed on the rear face 11b of the semiconductor substrate 11. The plurality of connection terminals 34 of the integrated circuit layer 30 and the plurality of connection terminals 24 of the integrated circuit layer 20 are arranged on the rear faces 11b, 21b at such positions as to oppose each other, while coming into contact with each other, so as to connect with each other electrically. The plurality of connection terminals 34 are favorably constituted by bump electrodes, for example.

The integrated circuit layer 30 has a plurality of first inspection rectifier device units 15 corresponding one-to-one to the plurality of connection terminals 34 for the signal leads. The first inspection rectifier device units 15 are constructed as in the first embodiment. However, the rectifier device 15a is connected in reverse between the positive power supply lead 13a and connection terminal 34 of the integrated circuit layer 30, while the rectifier device 15b is connected in reverse between the grounding lead 13b and connection terminal 34 of the integrated circuit layer 30. The rectifier devices 15a, 15b are connected to the connection terminal 34 through a through-silicon via (TSV) 37. The TSV 37 is a TSV for connecting leads in the wiring layer 13 and the plurality of connection terminals 34 on the rear face 11b to each other.

The semiconductor integrated circuit device 1B further comprises a handling substrate 8. The handling substrate 8 is bonded to the wiring layer 13 of the integrated circuit layer 30 by an adhesive layer 7b.

In the semiconductor integrated circuit device 1B in accordance with this embodiment, the inspection method illustrated in FIG. 3 favorably inspects the connection state between the connection terminals 34, 14. This can yield the same operations and effects as those of the above-mentioned first embodiment. However, the light from the inspection rectifier device unit 15 of the integrated circuit layer 30 is blocked by the adhesive layer 7a and connection terminals 24, 34.

Third Embodiment

Figure 8:
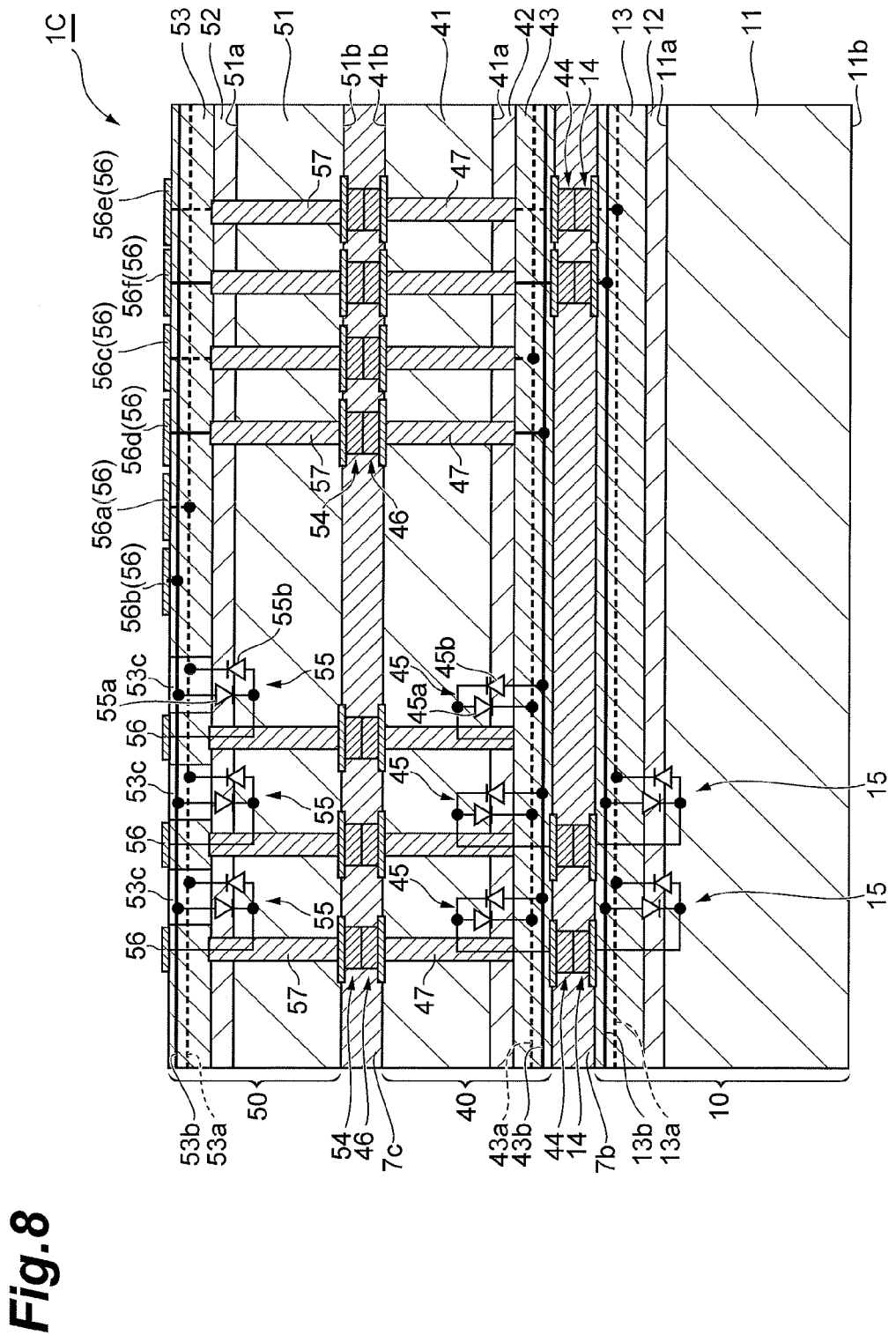
FIG. 8 is a sectional view illustrating the structure of a semiconductor integrated circuit device as a third embodiment.

FIG. 8 is a sectional view illustrating the structure of a semiconductor integrated circuit device 1C as the third embodiment. The semiconductor integrated circuit device 1C in accordance with this embodiment is constructed by stacking integrated circuit layers 10, 40, 50 in their thickness direction. In this embodiment, the integrated circuit layer 10 is constructed as in the first embodiment. In this embodiment, the integrated circuit layers 10, 40 are joined to each other such that the front face 11a of the semiconductor substrate 11 in the integrated circuit layer 10 and the front face 41a of a semiconductor substrate 41 in the integrated circuit layer 40 oppose each other. The integrated circuit layers 40, 50 are joined to each other such that the rear face 41b of the semiconductor substrate 41 in the integrated circuit layer 40 and the rear face 51b of a semiconductor substrate 51 in the integrated circuit layer 50 oppose each other.

The integrated circuit layer 40 comprises the semiconductor substrate (support layer) 41 having the front face 41a and rear face 41b, a device layer 42 disposed on the front face 41a of the semiconductor substrate 41, a wiring layer 43 disposed on the device layer 42, a plurality of connection terminals (electrodes) 44 for electrically connecting with the integrated circuit layer 10, and a plurality of connection terminals (electrodes) 46 for electrically connecting with the integrated circuit layer 50. The integrated circuit layer 50 comprises the semiconductor substrate (support layer) 51 having the front and rear faces 51a, 51b, a device layer 52 disposed on the front face 51a of the semiconductor substrate 51, a wiring layer 53 disposed on the device layer 52, and a plurality of connection terminals (electrodes) 54 for electrically connecting with the integrated circuit layer 40. Each of the device layers 42, 52 includes a semiconductor device group constituted by a plurality of semiconductor devices.

The wiring layers 43, 53 include a plurality of leads for electrically connecting a plurality of semiconductor devices included in their corresponding device layers 42, 52 to each other. The plurality of leads in the wiring layer 43 include positive power supply and grounding leads 43a, 43b for applying a power supply voltage to a plurality of semiconductor devices. The plurality of leads in the wiring layer 53 include positive power supply and grounding leads 53a, 53b for applying a power supply voltage to a plurality of semiconductor devices. The positive power supply leads 43a, 53a and grounding leads 43b, 53b are the first leads in this embodiment. In this embodiment, the positive power supply and grounding leads 13a, 13b of the integrated circuit layer 10, the positive power supply and grounding leads 43a, 43b of the integrated circuit layer 40, and the positive power supply and grounding leads 53a, 53b of the integrated circuit layers 50 are arranged independently from each other and not mutually connected.

The wiring layer 53 is provided with a plurality of light-transmitting regions 53c. The plurality of light-transmitting regions 53c are disposed at respective parts of the wiring layer 53 located on a plurality of inspection rectifier device units 55 which will be explained later. The light-transmitting regions 53c have a wiring density lower than that of the remaining region in the wiring layer 53, so as to transmit therethrough light from the inspection rectifier device unit 55 to the outside of the semiconductor integrated circuit device 1A. Preferably, the light-transmitting regions 53c are free of wiring.

The plurality of connection terminals 44, 54 are disposed on their corresponding wiring layers 43, 53. The plurality of connection terminals 44 and the plurality of connection terminals 14 of the integrated circuit layer 10 are arranged on their corresponding front faces 41a, 11a at such positions as to oppose each other, while coming into contact with each other, so as to connect with each other electrically. Similarly, the plurality of connection terminals 54 and the plurality of connection terminals 46 of the integrated circuit layer 40 are arranged on their corresponding rear faces 51b, 41b at such positions as to oppose each other, while coming into contact with each other, so as to connect with each other electrically. The plurality of connection terminals 44, 46, 54 are favorably constituted by bump electrodes, for example.

The integrated circuit layer 40 has a plurality of inspection rectifier device units 45. The plurality of inspection rectifier device units 45 are formed on the device layer 42 and correspond one-to-one to the plurality of connection terminals 44 for the signal leads. Each of the plurality of inspection rectifier device units 45 has rectifier devices 45a, 45b. The rectifier device 45a is connected in reverse between the positive power supply lead 43a and connection terminal 44 of the integrated circuit layer 40, while the rectifier device 45b is connected in reverse between the grounding lead 43b and connection terminal 44 of the integrated circuit layer 40.

The integrated circuit layer 50 has a plurality of inspection rectifier device units 55. The plurality of inspection rectifier device units 55 are formed on the device layer 52 and correspond one-to-one to the plurality of connection terminals 54. Each of the plurality of inspection rectifier device units 55 has rectifier devices 55a, 55b. The rectifier device 55a is connected in reverse between the positive power supply lead 53a and connection terminal 54 of the integrated circuit layer 50, while the rectifier device 55b is connected in reverse between the grounding lead 53b and connection terminal 54 of the integrated circuit layer 50. Detailed structural examples and modified examples of the inspection rectifier device units 45, 55 are the same as with the inspection rectifier device units 15, 25 of the first embodiment.

The integrated circuit layer 40 has a plurality of through-silicon vias (TSVs) 47 in order to connect the leads of the wiring layer 43 on the front face 41a of the semiconductor substrate 41 and a plurality of connection terminals (electrodes) 46 on the rear face 41b to each other. The integrated circuit layer 50 has a plurality of through-silicon vias (TSVs) 57 in order to connect the leads of the wiring layer 53 on the front face 51a of the semiconductor substrate 51 and a plurality of connection terminals (electrodes) 54 on the rear face 51b to each other.

The integrated circuit layer 50 also has a plurality of connection terminals (electrodes) 56 on the wiring layer 53 for electrically connecting with the integrated circuit layer further stacked on the integrated circuit layer 50. The plurality of connection terminals 56 include connection terminals 56a to 56f. The connection terminals 56a, 56b are electrically connected to the positive power supply and grounding leads 53a, 53b of the integrated circuit layer 50, respectively. The connection terminal 56c is electrically connected to the positive power supply lead 43a of the integrated circuit layer 40 through the TSV 57, connection terminals 54, 46, and TSV 47. By a similar structure, the connection lead 56d is electrically connected to the grounding lead 43b of the integrated circuit layer 40. The connection terminal 56e is electrically connected to the positive power supply lead 13a of the integrated circuit layer 10 through the TSV 57, connection terminals 54, 46, TSV 47, and connection terminals 44, 14. By a similar structure, the connection lead 56f is electrically connected to the grounding lead 13b of the integrated circuit layer 10.

Thus, the connection terminals 56a to 56f are provided in order to arrange respective power supply lines of the integrated circuit layers 10, 40, 50 independently from each other in this embodiment. The connection terminals 56a to 56f and the TSVs and connection terminals connected thereto constitute a voltage application unit for applying a bias voltage to the inspection rectifier device units 15, 45, 55.

The semiconductor integrated circuit device 1C further comprises adhesive layers 7b, 7c. The adhesive layer 7b is disposed in a gap between the integrated circuit layers 10, 40 and mechanically bonds them together. The adhesive layer 7c is disposed in a gap between the integrated circuit layers 40, 50 and mechanically bonds them together. The adhesive layers 7b, 7c preferably include a material which can block light from the inspection rectifier device units 15, 45.

In the semiconductor integrated circuit device 1C in accordance with this embodiment, the inspection method illustrated in FIG. 3 favorably inspects the connection state between the connection terminals 46, 54 by replacing the integrated circuit layers 10, 20 with the integrated circuit layers 40, 50, respectively. This can yield the same operations and effects as those of the above-mentioned first embodiment.

Fourth Embodiment

Figure 9:
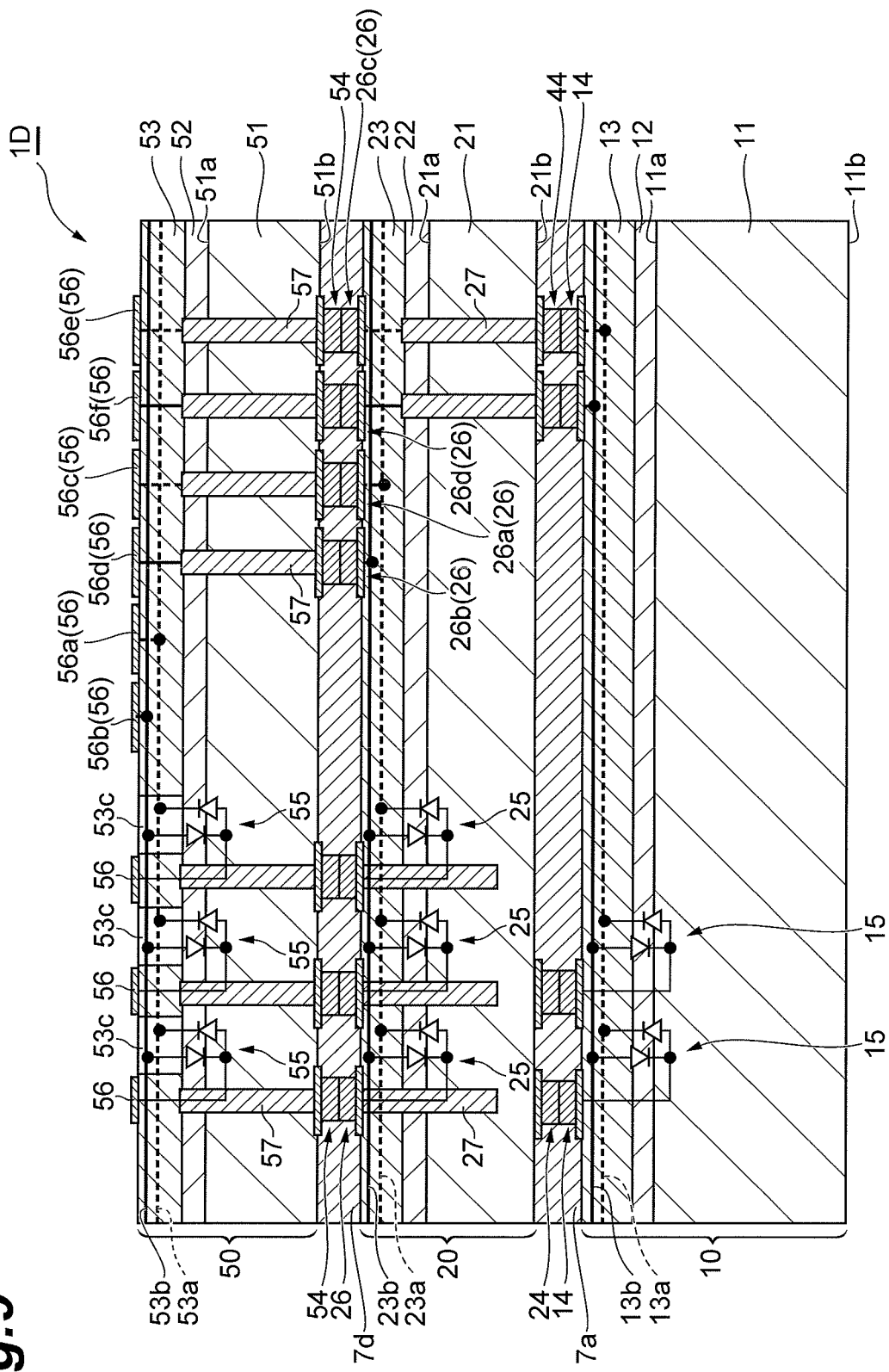
FIG. 9 is a sectional view illustrating the structure of a semiconductor integrated circuit device as a fourth embodiment.

FIG. 9 is a sectional view illustrating the structure of a semiconductor integrated circuit device 1D as the fourth embodiment. The semiconductor integrated circuit device 1D in accordance with this embodiment is constructed by stacking integrated circuit layers 10, 20, 50 in their thickness direction. In this embodiment, the integrated circuit layers 10, 20 are constructed as in the first embodiment, while the integrated circuit layer 50 is constructed as in the third embodiment. In this embodiment, the integrated circuit layers 20, 50 are joined together such that the front face 21a of the semiconductor substrate 21 in the integrated circuit layer 20 and the rear face 51b of the semiconductor substrate 51 in the integrated circuit layer 50 oppose each other.

A plurality of connection terminals 26 of the integrated circuit layer 20 and a plurality of connection terminals 54 of the integrated circuit layer 50 are arranged on the front face 21a and rear face 51b at such positions as to oppose each other, while coming into contact with each other, so as to connect with each other electrically.

The connection terminal 56c of the integrated circuit layer 50 is electrically connected to the positive power supply lead 23a of the integrated circuit layer 20 through the TSV 57 and connection terminals 54, 26a. The connection terminal 56d is electrically connected to the grounding lead 23b of the integrated circuit layer 20 through the TSV 57 and connection terminals 54, 26b. The connection terminal 56e is electrically connected to the positive power supply lead 13a of the integrated circuit layer 10 through the TSV 57, connection terminals 54, 26c, TSV 27, and connection terminals 24, 14. The connection terminal 56f is electrically connected to the grounding lead 13b of the integrated circuit layer 10 through the TSV 57, connection terminals 54, 26d, TSV 27, and connection terminals 24, 14.

The semiconductor integrated circuit device 1D further comprises an adhesive layer 7d. The adhesive layer 7d is disposed in a gap between the integrated circuit layers 20, 50 and mechanically bonds them together. The adhesive layer 7d preferably includes a material which can block light from the inspection rectifier device unit 25.

In the semiconductor integrated circuit device 1D in accordance with this embodiment, the inspection method illustrated in FIG. 3 favorably inspects the connection state between the connection terminals 54, 26 by replacing the integrated circuit layers 10, 20 with the integrated circuit layers 20, 50, respectively. This can yield the same operations and effects as those of the above-mentioned first embodiment.

Fifth Embodiment

Figure 10:
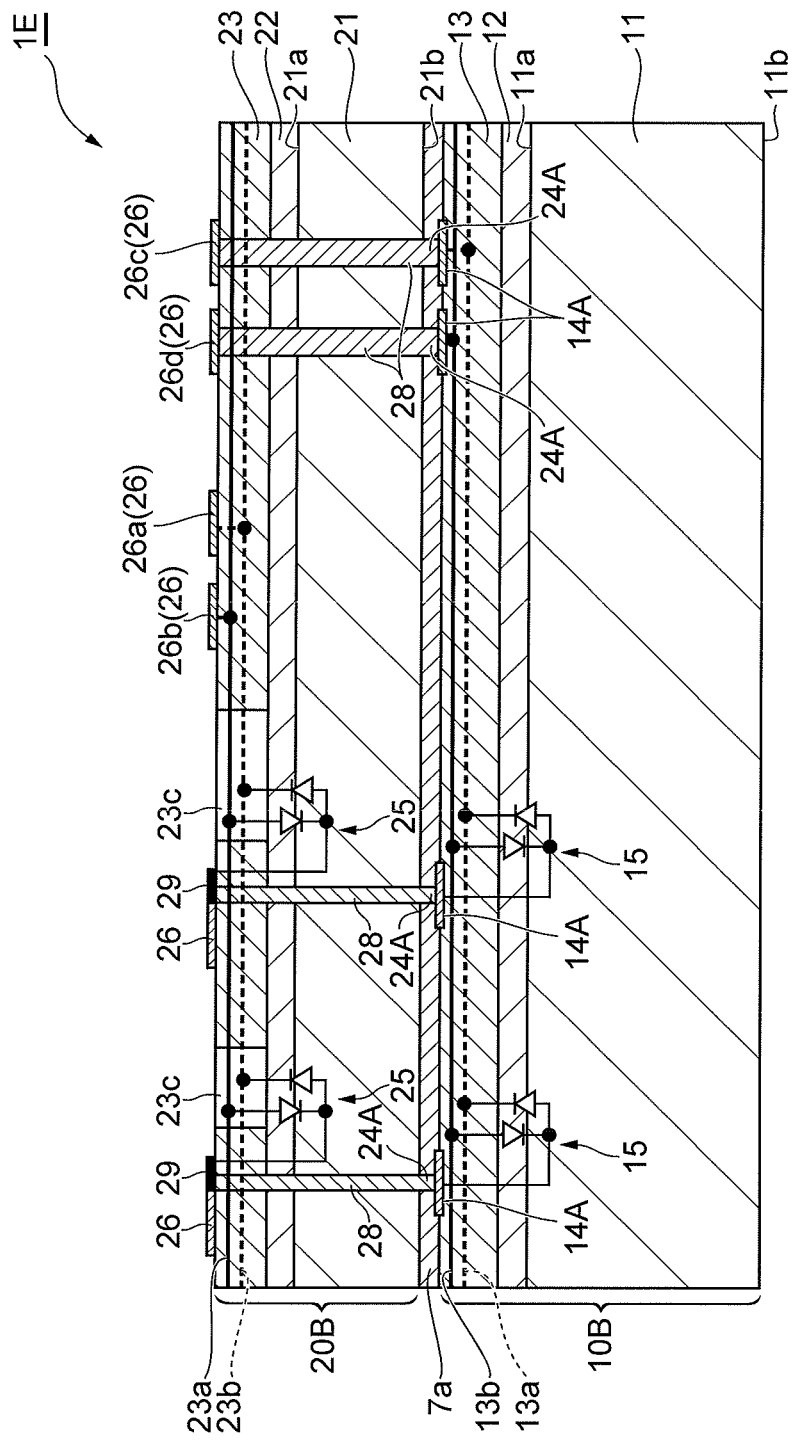
FIG. 10 is a sectional view illustrating the structure of a semiconductor integrated circuit device as a fifth embodiment.

FIG. 10 is a sectional view illustrating the structure of a semiconductor integrated circuit device 1E as the fifth embodiment. The semiconductor integrated circuit device 1E in accordance with this embodiment is constructed by stacking integrated circuit layers 10B, 20B in their thickness direction. In this embodiment, the integrated circuit layers 10B, 20B and their joint structure are constructed as with their corresponding integrated circuit layers 10, 20 in the first embodiment except for the following points.

The integrated circuit layers 10B, 20B in accordance with this embodiment have connection terminals 14A, 24A in place of the connection terminals 14, 24 in the first embodiment, respectively. The connection terminal 14A is a pad-shaped electrode instead of the bump electrode used in the first embodiment. As the connection terminal 24A, one end of a TSV 28 projects from the rear face 21b of the integrated circuit layer 20B, so as to come into contact with the connection terminal 14A. The other end of the TSV 28, when it is a signal lead, is in contact with a rewiring lead 29 disposed on the front face 21a of the semiconductor substrate 21, so as to be connected to a lead of the wiring layer 23 through the rewiring lead 29. The other end of the TSV 28, when it is a power supply or grounding lead, is in contact with a connection terminal 26 (26c, 26d) disposed on the front face 21a of the semiconductor substrate 21.

An interlayer connection structure such as that in this embodiment is produced, for example, by joining the integrated circuit layers 10B, 20B in such an orientation that the front face 11a and rear face 21b oppose each other, then forming a hole reaching the connection terminal 14A of the integrated circuit layer 10B from the front face 21a of the semiconductor substrate 21 by etching or the like, embedding a metal material in the hole, and thereafter forming the rewiring lead 29 (or connection hole 26) thereon. The operations and effects explained in the first embodiment can also be obtained favorably in an interlayer connection structure such as that in this embodiment.

Sixth Embodiment

Figure 11:
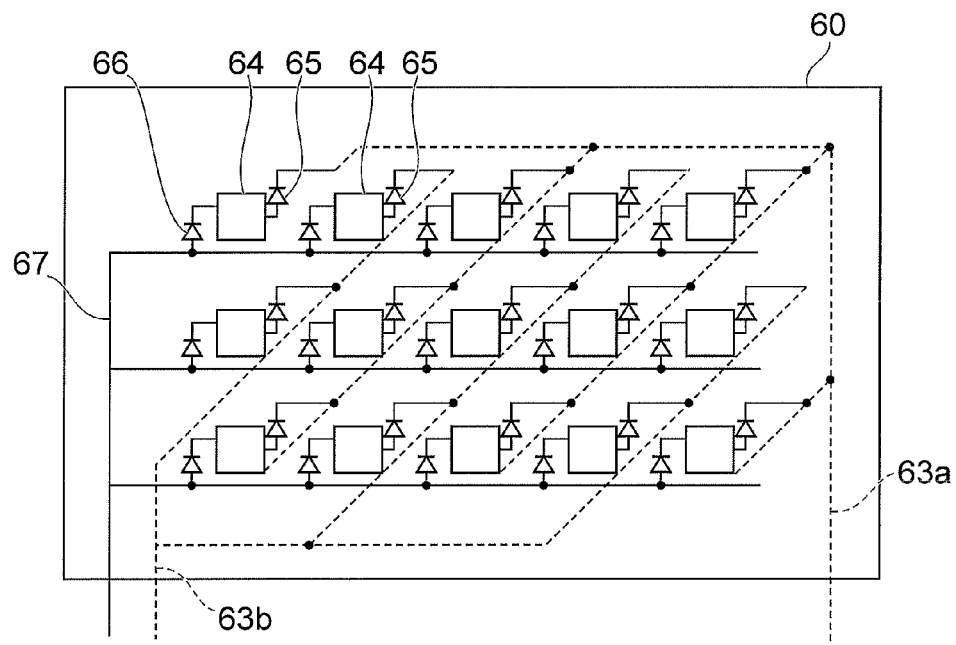
FIG. 11 is a diagram illustrating the structure of power supply and grounding leads as a sixth embodiment.

FIG. 11 is a diagram illustrating the structure of power supply and grounding leads as the sixth embodiment. In this embodiment, as illustrated in FIG. 11, at least two lines (two lines in this embodiment) of power supply leads 63a, 63b are provided for each integrated circuit layer 60 in order to apply a bias voltage to a plurality of inspection rectifier device units 65. A plurality of connection terminals 64 in the integrated circuit layer 60 are arranged two-dimensionally along two directions orthogonal to each other. FIG. 11 also illustrates an inspection rectifier device unit 66 and grounding lead 67 of another integrated circuit layer.

One power supply lead 63a applies a bias voltage to the inspection rectifier device units 65 electrically connected to a part of connection terminals 64 arranged in a lattice pattern among the plurality of connection terminals 64. The other power supply lead 63b applies a bias voltage to the inspection rectifier device units 65 electrically connected to the remaining connection terminals 64. Therefore, the connection terminal 64 connected to the inspection rectifier device unit 65 to which the bias voltage is applied from the power supply lead 63a and the connection terminal 64 connected to the inspection rectifier device unit 65 to which the bias voltage is applied from the power supply lead 63b are not adjacent to each other in the above-mentioned two directions.

Constructing the power supply leads as in this embodiment makes it possible to observe the light emitted from the inspection rectifier device units 65 connected to the above-mentioned part of connection terminals 64 and the light emitted from the inspection rectifier device units 65 connected to the remaining connection terminals 64 separately from each other. While each inspection rectifier device unit 65 emits light only when the bias voltage is applied thereto from its corresponding power supply lead 63a or 63b if there is no short circuit between the connection terminals 64 adjacent to each other, the inspection rectifier device unit 65 emits light when the bias voltage is applied to any of the power supply leads 63a, 63b if the adjacent connection terminals 64 are short-circuited. Observing the light emission can detect the short circuit between the adjacent connection terminals 64.

Though an example provided with at least two lines of power supply leads has been explained, providing at least two lines of grounding leads or combining at least two lines each of power supply and grounding leads together can also yield the same effects as those mentioned above.

Seventh Embodiment

Figure 12:
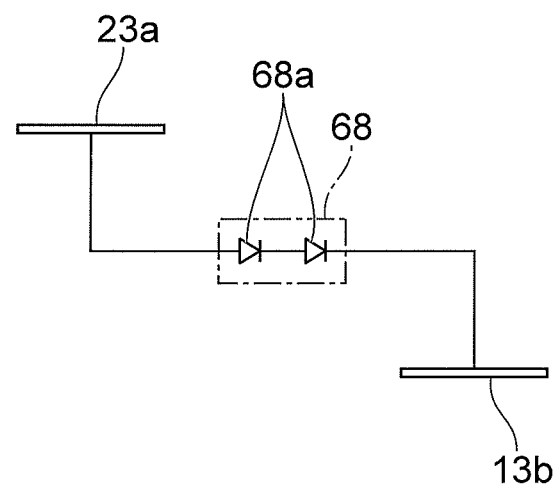
FIG. 12 is a diagram illustrating the structure of a voltage application unit as a seventh embodiment.

FIG. 12 is a diagram illustrating the structure of a power application unit 68 as the seventh embodiment. The power application unit 68 is connected between the positive power supply lead 23a of the integrated circuit layer 20 and the grounding lead 13b of the integrated circuit layer 10 (or between the positive power supply lead 13a and grounding lead 23b) illustrated in FIG. 1. This power application unit 68 includes at least one photoelectric transducer (diode) 68a. In the example illustrated in FIG. 12, two photoelectric transducers 68a are connected in series. The photoelectric transducers 68a are connected to the positive power supply lead 23a (or the positive power supply lead 13a) on the anode side, while the photoelectric transducers 68a are connected to the grounding lead 13b (or the grounding lead 23b) on the cathode side. The photoelectric transducers 68a generate an inspection bias voltage in response to an energy input (light input) from outside of the semiconductor integrated circuit device 1A.

Providing at least one of the integrated circuit layers 10, 20 with the voltage application unit 68 such as that of this embodiment can apply a bias voltage to the inspection rectifier device units 15, 25 without probing, thereby making it possible to further reduce the number of probing operations (or eliminate probing) in the inspection. The device achieving such a voltage application unit is not limited to photoelectric transducers, while other kinds of devices may be employed as long as they can generate an electromotive force in response to an energy line incident thereon from the outside. For example, at least one of the integrated circuit layers 10, 20 may be provided with a coil unit as an electromotive force device. This can generate a bias voltage by irradiating the coil unit with a magnetic field.

Eighth Embodiment

Figure 13:
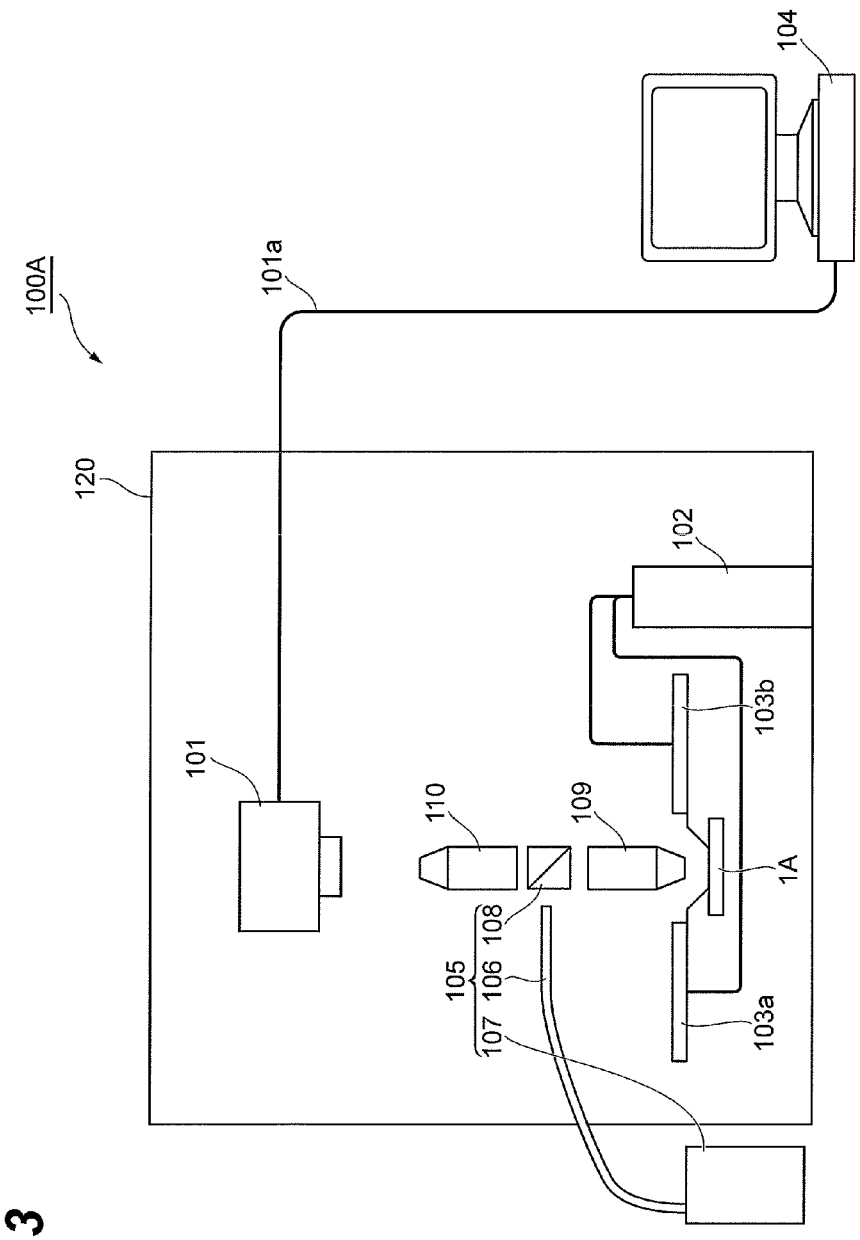
FIG. 13 is a diagram illustrating the structure of an inspection device as an eighth embodiment.

FIG. 13 is a diagram illustrating the structure of an inspection device 100A as the eighth embodiment. This inspection device 100A is a device for favorably performing the inspection method of the semiconductor integrated circuit devices in accordance with the above-mentioned first to seventh embodiments (the semiconductor integrated circuit device 1A in accordance with the first embodiment being representatively illustrated in the diagram).

For capturing light emitted from the inspection rectifier device unit 25 of the semiconductor integrated circuit device 1A as an image, the inspection device 100A comprises a camera 101 for capturing an image including the emitted light, a power supply 102 for generating a bias voltage having a sufficient magnitude for inspection, probes (voltage application means) 103a, 103b for forwardly applying the bias voltage to the inspection rectifier device units 15, 25, and a control system 104 for inspecting whether or not there is a connection failure according to the image from the camera 101. An objective lens 109 and an imaging lens 110 are disposed between the camera 101 and the semiconductor integrated circuit device 1A, so that the camera 101 captures the image of the light emitted from the inspection rectifier device unit 25 through the objective lens 109 and imaging lens 110. The camera 101 is electrically connected to the control system 104 through a camera cable 101a, so as to feed imaging data to the control system 104, while its operation is controlled by the control system 104.

The inspection device 100A further comprises an illumination system 105 for observing patterns of integrated circuits. The illumination system 105 includes a light guide 106, a lamp light source 107, and a beam splitter 108. Light emitted from the lamp light source 107 reaches the beam splitter 108 through the light guide 106. The beam splitter 108, which is arranged between the objective lens 109 and imaging lens 110, reflects the light from the lamp light source 107 to the semiconductor integrated circuit device 1A and transmits therethrough the light emitted from the semiconductor integrated circuit device 1A. This illumination system 105 allows the camera 101 to capture the integrated circuit pattern of the uppermost integrated circuit layer 20 in addition to the light emitted from the inspection rectifier device unit 25. The image including the integrated circuit pattern can be used when aligning layout data with the rear face pattern image at the time of comparing the captured data with reference data.

Preferably, among the constituents of the inspection device 100A mentioned above, those other than the control system 104 and lamp light source 107 are accommodated in a dark box 120. The camera 101, which is arranged above the semiconductor integrated circuit device 1A in this embodiment, may be arranged under the semiconductor integrated circuit device 1A.

Ninth Embodiment

Figure 14:
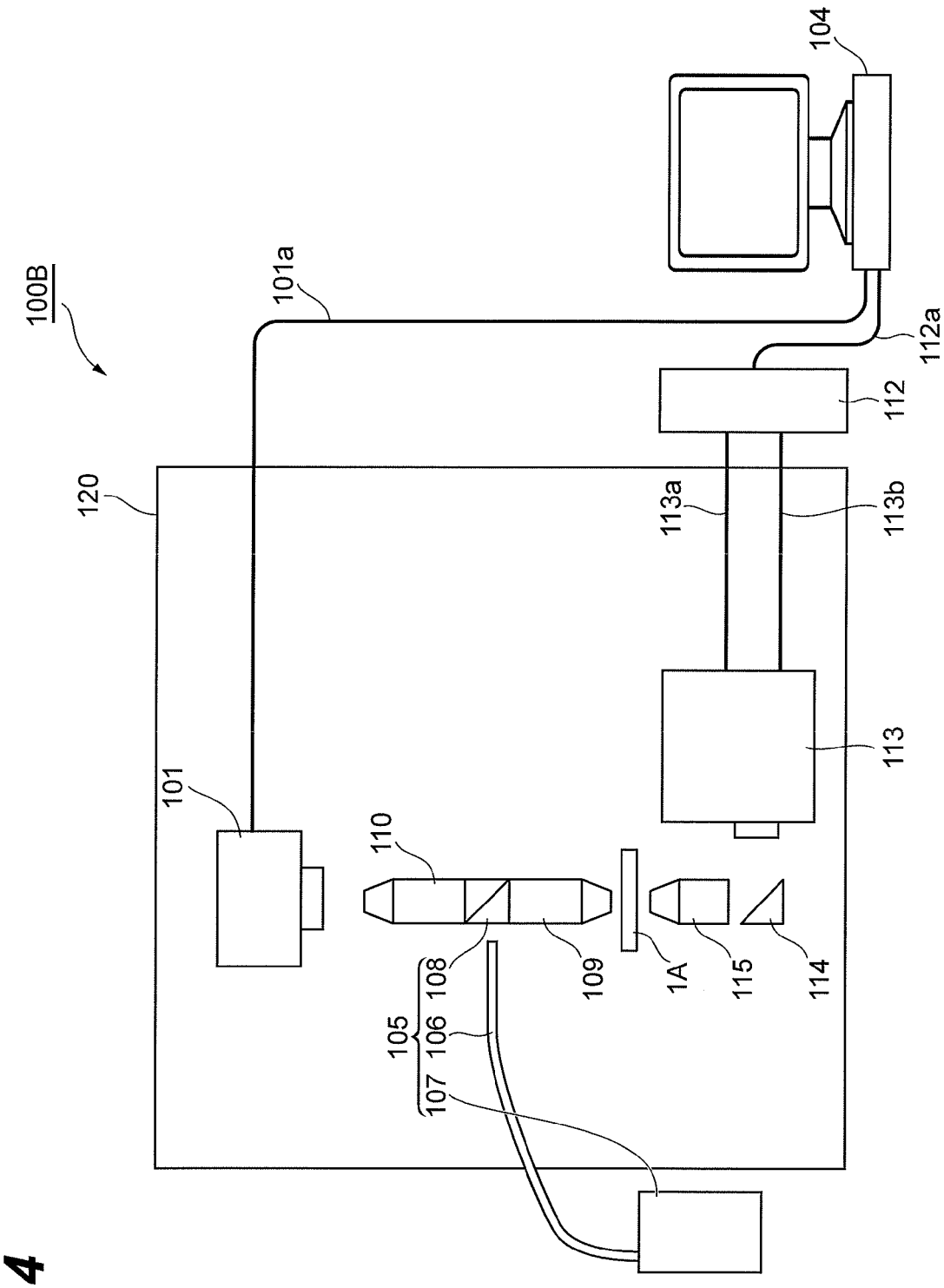
FIG. 14 is a diagram illustrating the structure of an inspection device as a ninth embodiment.

FIG. 14 is a diagram illustrating the structure of an inspection device 100B as the ninth embodiment. This inspection device 100B is a device for favorably performing the inspection method of the semiconductor integrated circuit devices in accordance with the above-mentioned first to seventh embodiments.

This inspection device 100B comprises a laser light source 112, a laser scanner 113, a mirror 114, and an objective lens 115 in addition to the structure of the above-mentioned inspection device 100A (FIG. 13). These constituents are used for irradiating the voltage application unit having the structure illustrated in FIG. 12, for example, with laser light as an energy line. The laser light source 112 produces laser light having a wavelength suitable for generating an electromotive force in the voltage application unit. The laser light source 112 is electrically connected to the control system 104 through a laser control cable 112a, so that its emission timing and the like are controlled by the control system 104. The laser scanner 113 receives the laser light from the laser light source 112 through the optical fiber cable 113a and changes the position at which the semiconductor integrated circuit device 1A is irradiated with the laser light. The laser scanner 113 is electrically connected to the laser light source 112 through a scanner control cable 113b, so as to control its scan direction.

The mirror 114 is arranged between the beam splitter 108 and imaging lens 110. The wavelength-selective mirror 114 is arranged below the semiconductor integrated circuit device 1A (i.e., on the opposite side of the semiconductor integrated circuit device 1A from the camera 101). The mirror 114 reflects the laser light emitted from the laser scanner 113 to the semiconductor integrated circuit device 1A. The laser light reflected by the mirror 114 passes through the objective lens 115, so as to be made incident on the rear face 11b side of the semiconductor integrated circuit device 1A.

As in this embodiment, the inspection device for inspecting the semiconductor integrated circuit device may comprise a structure for emitting an energy line for generating an electromotive force in the semiconductor integrated circuit device in place of the probes 103a, 103b and bias power supply 102 illustrated in FIG. 13. In order for the laser light to be used by a laser microscope as well, a sensor for detecting the reflected light of the laser light may be provided separately. The laser light, which is emitted from under the semiconductor integrated circuit device 1A (the side opposite from the camera 101) in this embodiment, may be emitted from above the semiconductor integrated circuit device 1A (the same side as with the camera 101). The reflection of the laser light from the semiconductor integrated circuit device 1A may be utilized for specifying the position irradiated with the laser light (the position of the voltage application unit). Specifically, another optical fiber cable connecting the laser scanner 113 and laser light source 112 to each other may be prepared, so as to transmit the reflected light from the semiconductor integrated circuit device 1A to the laser light source 112, thereby forming an image in combination with scanner position information, thus determining an appropriate irradiation position. Alternatively, the laser light source 112, laser scanner 113, and mirror 114 in accordance with this embodiment may constitute LSM (laser scanning microscopy), so as to acquire a reflection image from the integrated circuit device 1A by using the LSM, detect an appropriate irradiation position (position of the voltage application unit) according to the reflection image, and irradiate this position with the laser light.

Without being restricted to the above-mentioned embodiments, the semiconductor integrated circuit device and its inspection method in accordance with the present invention can be modified in various ways. For example, various materials can be employed for the support layer without being restricted to the semiconductor substrate (silicon substrate) exemplified as the support layer for each integrated circuit layer in each of the above-mentioned embodiments. For example, when the integrated circuit layer is one produced by eliminating a silicon layer from a substrate having a so-called SOI (Silicon On Insulator) structure, the integrated circuit layer has an oxide film layer as a support layer. In this case, the TSVs formed in the support layer are not TSV as in the above-mentioned embodiments, but just via contacts. The semiconductor integrated circuit devices in accordance with the above-mentioned embodiments can also be used for OBIRCH (Optical Beam Induced Resistance CHange) tests, OBIC (Optical Beam Induced Current) tests, and the like.

In each of the above-mentioned embodiments, the bump electrode acting as a connection terminal may be a one-sided bump, and a TSV may be used in place of the bump electrode. Metal films acting as connection terminals may directly be joined together without providing bump electrodes. Though the above-mentioned embodiments use an adhesive layer for bonding the integrated circuit layers together, metal films may be formed in regions other than the connection terminals in the integrated circuit layers and directly bonded together. A gap may be formed between two integrated circuit layers as long as each integrated circuit layer has a sufficient mechanical strength.

Though each of the above-mentioned embodiments uses power supply and grounding leads as the first leads for applying a bias voltage to the inspection rectifier device units, the semiconductor integrated circuit device may be equipped with dedicated leads for applying a bias voltage to the inspection rectifier device units as the first leads. The same effects as those of the above-mentioned embodiments can also be obtained when the first leads for applying a bias voltage are provided for inspection independently from the semiconductor device group of each integrated circuit layer.

The inspection rectifier device units in the semiconductor integrated circuit devices in accordance with the above-mentioned embodiments may be provided in each integrated circuit layer for the purpose of inspection alone or utilize rectifier devices (diodes and the like) formed parasitically on integrated circuits including semiconductor device groups within integrated circuit layers.

The rectifier devices of the inspection rectifier device units in the semiconductor integrated circuit devices in accordance with the above-mentioned embodiments may have a structure in which an insulating thin film and an electrode film are stacked in sequence on a silicon substrate. Utilizing the tunnel effect occurring in the insulating thin film when a bias voltage is applied between the electrode film and silicon substrate and the light emission at the time when a current passes through the insulating thin film can favorably achieve the inspection rectifier device units in each of the above-mentioned embodiments.

Though each of the above-mentioned embodiments exemplifies a structure in which a forward bias voltage is applied to the rectifier devices in the inspection rectifier device units, the reverse-bias resistance of the rectifier devices may be lowered, so that the bias voltage to the rectifier devices becomes a reverse bias during both inspection and normal operation. In this case, as leads for applying a bias voltage to the inspection rectifier device units, the power supply lead of one integrated circuit layer and the power supply lead of another integrated circuit layer may be used. Alternatively, as the leads for applying a bias voltage to the inspection rectifier device units, the grounding lead of one integrated circuit layer and the grounding lead of another integrated circuit layer may be used. Applying a bias voltage such that the rectifier device on the observation side attains a reverse bias and observing a hot-carrier emission or a light emission caused by a tunnel current can make the emission size smaller than that of the recombination emission occurring when a forward current flows through a diode.

Though each of the above-mentioned embodiments blocks the light emitted from the inspection rectifier device unit of one integrated circuit layer with the adhesive layer or wiring layer, so as to make the light emitted from the inspection rectifier device unit of the other integrated circuit layer easier to observe, such light-blocking means are not limited to the adhesive layer and wiring layer, whereby other light-blocking members may also be used.

As the light emission area per inspection rectifier device unit is made smaller, light emissions from a plurality of inspection rectifier device units are easier to observe in each of the above-mentioned embodiments. Therefore, the inspection rectifier device unit preferably has a structure for preventing its rectifier devices (or light-emitting devices provided separately from the rectifier devices) from diffusing carriers, for example.

INDUSTRIAL APPLICABILITY

The present invention can be utilized as an inspection method and semiconductor integrated circuit device which can inspect, in a short time every time a layer is stacked, whether or not an interlayer connection failure exists in a semiconductor integrated circuit device constructed by stacking a plurality of integrated circuit layers in their thickness direction.

REFERENCE SIGNS LIST 1A to 1E . . . semiconductor integrated circuit device; 7a to 7d . . . adhesive layer; 8 . . . handling substrate; 10, 20 . . . integrated circuit layer; 11, 21 . . . semiconductor substrate; 12, 22 . . . device layer; 13, 23 . . . wiring layer; 13a, 23a . . . positive power supply lead; 13b, 23b . . . grounding lead; 14, 24 . . . connection terminal; 15, 25 . . . inspection rectifier device unit; 15a, 15b, 25a, 25b . . . rectifier device; 16, 26 . . . connection terminal; 17, 27 . . . through-silicon via; 23c . . . light-transmitting region; 68 . . . voltage application unit; 68a . . . photoelectric transducer; 100A, 100B . . . inspection device; 101 . . . camera; 102 . . . bias power supply; 103a, 103b . . . probe; 104 . . . control system; 105 . . . illumination system; 107 . . . lamp light source; 108 . . . beam splitter; 109, 115 . . . objective lens; 110 . . . imaging lens; 112 . . . laser light source; 113 . . . laser scanner; 114 . . . mirror

The invention claimed is:

1. A semiconductor integrated circuit device inspection method for inspecting a semiconductor integrated circuit device constructed by stacking a plurality of integrated circuit layers, each including a support layer having front and rear faces, a semiconductor device group formed on the front face of the support layer, and a wiring layer including a first lead formed on the front face of the support layer, in a thickness direction thereof;

the method comprising the steps of:

forming, when making a first of the integrated circuit layers, on the front face a plurality of first inspection rectifier device units connected between a plurality of connection terminals for electrically connecting with a second of the integrated circuit layers and the first lead and adapted to emit light in response to a current, each of the first inspection rectifier device units including a rectifier device;

forming, when making the second integrated circuit layer, on the front face a plurality of second inspection rectifier device units connected between a plurality of connection terminals for electrically connecting with the first integrated circuit layer and the first lead and adapted to emit light in response to a current, each of the second inspection rectifier device units including a rectifier device, while providing a light-transmitting region in the wiring layer on the second inspection rectifier device units, the light-transmitting region having a wiring density lower than that in the remaining region;

causing the rear face of the second integrated circuit layer and the first integrated circuit layer to oppose each other when stacking the second integrated circuit layer on top of the first integrated circuit layer;

electrically connecting the plurality of connection terminals in the first integrated circuit layer and the plurality of connection terminals in the second integrated circuit layer to each other and then applying a bias voltage to the first and second inspection rectifier device units through the first leads of the first and second integrated circuit layers; and inspecting a connection state between the plurality of connection terminals of the first integrated circuit layer and the plurality of connection terminals of the second integrated circuit layer according to a light emission of the second inspection rectifier device unit observed through the light-transmitting region on the front face side of the second integrated circuit layer.

2. A semiconductor integrated circuit device inspection method according to claim 1, wherein the first and second inspection rectifier device units further include a light-emitting device connected in series to the rectifier device.

3. A semiconductor integrated circuit device inspection method according to claim 1, wherein the rectifier devices of the first and second inspection rectifier device units emit light in response to a current.

4. A semiconductor integrated circuit device inspection method according to claim 1, wherein at least one of the first and second integrated circuit layers is formed with a voltage application unit for generating the bias voltage in response to an energy input from outside of the semiconductor integrated circuit device.

5. A semiconductor integrated circuit device inspection method according to claim 4, wherein the voltage application unit includes a photoelectric transducer for generating an electromotive force in response to light emitted from outside of the semiconductor integrated circuit device.

6. A semiconductor integrated circuit device inspection method according to claim 1, wherein the first lead of the first integrated circuit layer is one of positive power supply and grounding leads formed on the front face of the support layer so as to supply a power supply voltage to the semiconductor device group;
wherein the first lead of the second integrated circuit layer is the other of the positive power supply and grounding leads formed on the front face of the support layer so as to supply the power supply voltage to the semiconductor device group;
wherein the rectifier devices of the plurality of first inspection rectifier device units are connected in reverse to the one lead when making the first integrated circuit layer; and
wherein the rectifier devices of the plurality of second inspection rectifier device units are connected in reverse to the other lead when making the second integrated circuit layer.

7. A semiconductor integrated circuit device inspection method according to claim 1, wherein the first leads of the plurality of integrated circuit layers are provided for inspection independently from the semiconductor device groups.

8. A semiconductor integrated circuit device constructed by stacking a plurality of integrated circuit layers in a thickness direction thereof, each of the integrated circuit layers including a support layer having front and rear faces, a semiconductor device group formed on the front face of the support layer, and a wiring layer including a first lead formed on the front face of the support layer;
wherein a first of the integrated circuit layers has:
a plurality of connection terminals for electrically connecting with a second of the integrated circuit layers; and
a plurality of first inspection rectifier device units formed on the front face, connected between the respective connection terminals and the first lead, and adapted to emit light in response to a current, each of the first inspection rectifier device units including a rectifier device;
wherein the second of the integrated circuit layers has:
a plurality of connection terminals for electrically connecting with the first integrated circuit layer;
a plurality of second inspection rectifier device units formed on the front face, connected between the respective connection terminals and the first lead, and adapted to emit light in response to a current, each of the second inspection rectifier device units including a rectifier device; and
a light-transmitting region, formed in the wiring layer on the second inspection rectifier device units, having a wiring density lower than that in the remaining region;
wherein the rear face of the second integrated circuit layer and the first integrated circuit layer oppose each other;
wherein the plurality of connection terminals of the first integrated circuit layer and the plurality of connection terminals of the second integrated circuit layer are electrically connected to each other; and
wherein the semiconductor integrated circuit device further comprises a voltage application unit for applying a bias voltage to the first and second inspection rectifier device units through the first leads of the first and second integrated circuit layers.

9. A semiconductor integrated circuit device according to claim 8, wherein the first and second inspection rectifier device units further include a light-emitting device connected in series to the rectifier device.

10. A semiconductor integrated circuit device according to claim 8, wherein the rectifier devices of the first and second inspection rectifier device units emit light in response to a current.

11. A semiconductor integrated circuit device according to claim 8, wherein the voltage application unit is provided with at least one of the first and second integrated circuit layers and generates the bias voltage in response to an energy input from outside of the semiconductor integrated circuit device.

12. A semiconductor integrated circuit device according to claim 11, wherein the voltage application unit includes a photoelectric transducer for generating an electromotive force in response to light emitted from outside of the semiconductor integrated circuit device.

13. A semiconductor integrated circuit device according to claim 8, wherein the first lead of the first integrated circuit layer is one of positive power supply and grounding leads formed on the front face of the support layer so as to supply a power supply voltage to the semiconductor device group;
wherein the first lead of the second integrated circuit layer is the other of the positive power supply and grounding leads formed on the front face of the support layer so as to supply the power supply voltage to the semiconductor device group;
wherein the rectifier devices of the plurality of first inspection rectifier device units are connected in reverse to the one lead; and
wherein the rectifier devices of the plurality of second inspection rectifier device units are connected in reverse to the other lead.

14. A semiconductor integrated circuit device according to claim 8, wherein the leads of the plurality of integrated circuit layers are provided for inspection independently from the semiconductor device groups.

* * * * *